United States Patent
Nakamura et al.

(10) Patent No.: US 10,512,994 B2
(45) Date of Patent: Dec. 24, 2019

(54) TABLE APPARATUS, POSITIONING APPARATUS, FLAT PANEL DISPLAY MANUFACTURING APPARATUS, AND PRECISION MACHINE

(71) Applicant: NSK LTD., Tokyo (JP)

(72) Inventors: Tsuyoshi Nakamura, Kanagawa (JP); Takashi Kuramochi, Kanagawa (JP)

(73) Assignee: NSK LTD., Tokyo (JP)

( * ) Notice: Subject to any disclaimer, the term of this patent is extended or adjusted under 35 U.S.C. 154(b) by 202 days.

(21) Appl. No.: 15/746,950

(22) PCT Filed: Mar. 15, 2016

(86) PCT No.: PCT/JP2016/058196
§ 371 (c)(1),
(2) Date: Jan. 23, 2018

(87) PCT Pub. No.: WO2017/017988
PCT Pub. Date: Feb. 2, 2017

(65) Prior Publication Data
US 2019/0337106 A1    Nov. 7, 2019

(30) Foreign Application Priority Data

Jul. 30, 2015   (JP) .................................. 2015-150568
Jan. 12, 2016   (JP) .................................. 2016-003425

(51) Int. Cl.
*B25B 11/00* (2006.01)
*B23Q 1/62* (2006.01)
(Continued)

(52) U.S. Cl.
CPC ............ *B23Q 1/623* (2013.01); *F16C 29/008* (2013.01); *G03F 7/0007* (2013.01);
(Continued)

(58) Field of Classification Search
CPC .. B25B 11/00; B25B 1/02; B25B 5/00; B25B 11/02; B23Q 1/03; B23Q 1/25
See application file for complete search history.

(56) References Cited

U.S. PATENT DOCUMENTS

2002/0079276 A1   6/2002   Miyake
2016/0318140 A1   11/2016  Higuchi et al.

FOREIGN PATENT DOCUMENTS

JP   2003-077825 A   3/2003
JP   2012-112715 A   6/2012
(Continued)

OTHER PUBLICATIONS

International Search Report for PCT/JP2016/058196, dated Jun. 14, 2014.
Written Opinion for PCT/JP2016/058196, dated Jun. 14, 2014.

*Primary Examiner* — Lee D Wilson
(74) *Attorney, Agent, or Firm* — Sughrue Mion, PLLC

(57) ABSTRACT

A table apparatus includes a first driver applying force in a first axis direction to a table, and a second driver applying force in a second axis direction to the table. The first driver includes a first actuator generating power for moving the table in the first axis direction, and a first movable member moving along a first drive axis parallel to the first axis by actuation of the first actuator. The first movable member includes: a first linear bearing moving along the first drive axis; a first rotary bearing disposed around a first rod member fixed to the first linear bearing and rotatable relative to the first rod member; and a second linear bearing connected to the first rotary bearing and guided in the second axis direction by a second guide member fixed to an edge of the table in the first axis direction.

14 Claims, 19 Drawing Sheets

(51) Int. Cl.
 *F16C 29/00* (2006.01)
 *G03F 7/00* (2006.01)
 *G03F 7/20* (2006.01)
 *H01L 21/683* (2006.01)
 *G01D 11/30* (2006.01)
 *H01L 21/68* (2006.01)
(52) U.S. Cl.
 CPC ...... *G03F 7/70716* (2013.01); *F16C 2322/39* (2013.01); *G01D 11/30* (2013.01); *H01L 21/68* (2013.01); *H01L 21/683* (2013.01)

(56) References Cited

FOREIGN PATENT DOCUMENTS

| | | |
|---|---|---|
| JP | 2014-098731 A | 5/2014 |
| JP | 2015-117958 A | 6/2015 |

FIG.5A
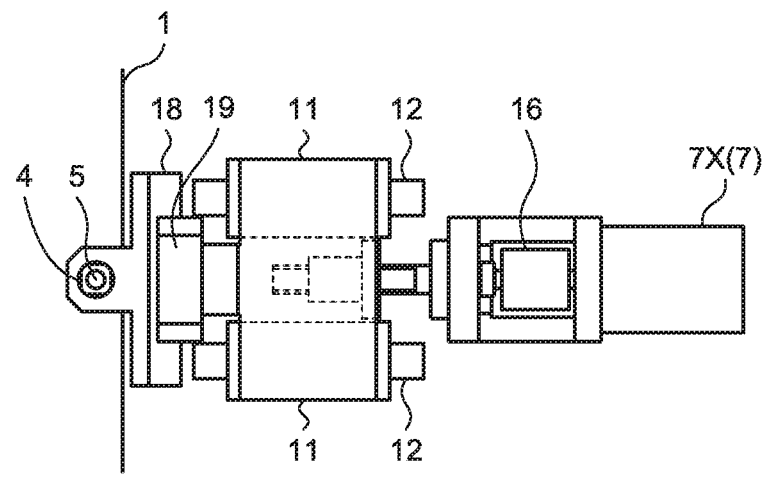
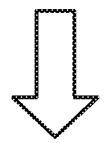
FIG.5B
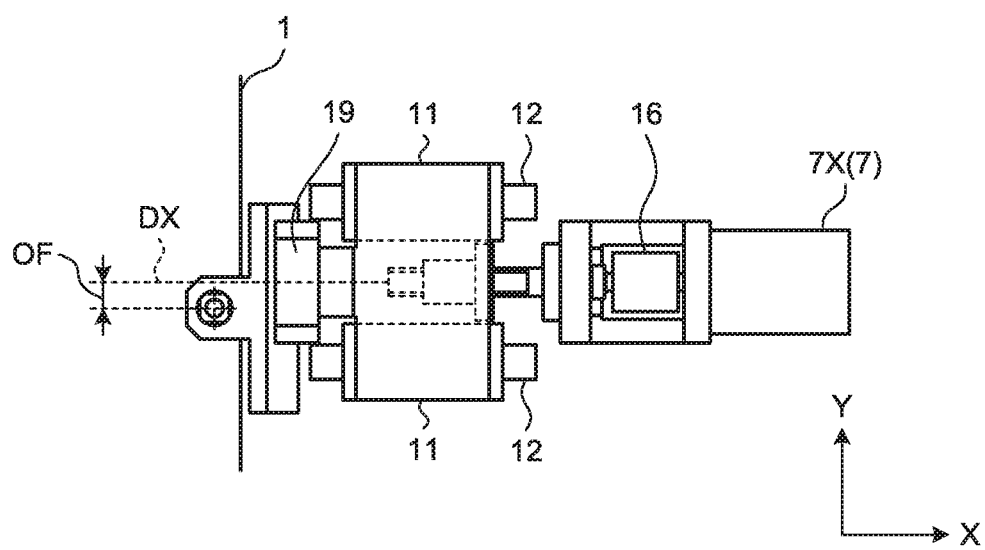

TABLE APPARATUS, POSITIONING APPARATUS, FLAT PANEL DISPLAY MANUFACTURING APPARATUS, AND PRECISION MACHINE

CROSS REFERENCE TO RELATED APPLICATIONS

This application is a National Stage of PCT International Application No. PCT/JP2016/058196 filed on Mar. 15, 2016, which designates the United States, incorporated herein by reference, and which is based upon and claims the benefit of priority from Japanese Patent Application No. 2015-150568 filed on Jul. 30, 2015, and Japanese Patent Application No. 2016-003425 filed on Jan. 12, 2016, the entire contents of which are incorporated herein by reference.

BACKGROUND

1. Technical Field

The present invention relates to a table apparatus, a positioning apparatus, a flat panel display manufacturing apparatus, and a precision machine.

2. Description of the Related Art

A table apparatus having a table that supports a workpiece is used in processes of manufacturing or measuring a device. The table apparatus moves the table to determine the position of the workpiece supported on the table. Known is a table apparatus capable of moving a table in three directions, i.e., an X axis direction, a Y axis direction, and a θZ direction, as disclosed in Prior Art 1 and 2.

PRIOR ART

Prior Art 1: Japanese Laid-open Patent Publication No. 2012-112715
Prior Art 2: Japanese Laid-open Patent Publication No. 2015-117958

Insufficient accuracy in positioning the table movable in the three directions may reduce the performance of a device to be manufactured. Accordingly, there is a demand for a technology to prevent the insufficient accuracy in positioning the table movable in the three directions.

An aspect of the present invention is directed to providing a table apparatus, a positioning apparatus, a flat panel display manufacturing apparatus, and a precision machine, which can prevent the insufficient positioning accuracy.

SUMMARY

According to a first aspect of the present invention, there is provided a table apparatus that includes: a base member having a guide surface; a table that is supported on the base member, is movable in a first axis direction parallel to a first axis in a predetermined plane parallel to the guide surface and in a second axis direction parallel to a second axis orthogonal to the first axis in the predetermined plane, and is rotatable about a central axis of the table parallel to a third axis orthogonal to the predetermined plane; a first driver that applies force in the first axis direction to the table; and a second driver that applies force in the second axis direction to the table. The first driver includes: a first actuator that is supported by the base member and generates power for moving the table in the first axis direction; and a first movable member that is coupled to the table and moves along a first drive axis parallel to the first axis by actuation of the first actuator. The second driver includes: a second actuator that is supported by the base member and generates power for moving the table in the second axis direction; and a second movable member that is coupled to the table and moves along a second drive axis parallel to the second axis by actuation of the second actuator. The first driver is only one first driver, and the only one first driver is provided such that, in the second axis direction, a position of the central axis of the table is aligned with a position of the first drive axis. The second driver comprises at least two second drivers, and the at least two second drivers are provided such that, in the first axis direction, a position of the central axis of the table differs from a position of each second drive axis. The first movable member includes: a first linear bearing that is guided by a first guide member provided on the base member and moves along the first drive axis; a first rotary bearing that is disposed around a first rod member fixed to the first linear bearing and is rotatable relative to the first rod member about a central axis of the first rod parallel to the third axis; and a second linear bearing that is connected to the first rotary bearing and is guided in the second axis direction by a second guide member fixed to an edge of the table in the first axial direction.

According to the first aspect of the present invention, the one first driver and the at least two second drivers can move the table in three directions, i.e., the first axis direction, the second axis direction, and the direction of rotation about the central axis of the table. The first driver is provided such that the position of the central axis of the table is aligned with the position of the first drive axis in the second axis direction, thereby preventing interference between the second guide member fixed to the edge of the table in the first axis direction and the second linear bearing when the table rotates. Moreover, the first linear bearing moving along the first drive axis on the base member and the second linear bearing fixed to the table and moving in the second axis direction are coupled to each other via the first rod member and the first rotary bearing. Thus, even when the table rotates about the central axis of the table, the relative rotation between the first rod member and the first rotary bearing prevents a moment from acting on the second linear bearing and the second guide member. This prevents the insufficient positioning accuracy of the table apparatus.

According to the first aspect of the present invention, it is preferable that the second movable member includes: a third linear bearing that is guided by a third guide member provided on the base member and moves along the second drive axis; a second rotary bearing that is disposed around a second rod member fixed to the third linear bearing and is rotatable relative to the second rod member about a central axis of the second rod parallel to the third axis; and a fourth linear bearing that is connected to the second rotary bearing and is guided in the first axis direction by a fourth guide member fixed to an edge of the table in the second axis direction.

The third linear bearing moving along the second drive axis on the base member and the fourth linear bearing fixed to the table and moving in the first axis direction are coupled to each other via the second rod member and the second rotary bearing. Thus, even when the table rotates about the central axis of the table, the relative rotation between the second rod member and the second rotary bearing prevents a moment from acting on the fourth linear bearing and the fourth guide member. This prevents the insufficient positioning accuracy of the table apparatus.

According to the first aspect of the present invention, the second driver may be connected to one edge of the table in the second axis direction, and the table apparatus may further include: a fifth linear bearing that is guided by a fifth guide member provided on the base member and moves in the second axis direction; a third rotary bearing that is disposed around a third rod member fixed to the fifth linear bearing and is rotatable relative to the third rod member about a central axis of the third rod parallel to the third axis; and a sixth linear bearing that is connected to the third rotary bearing and is guided in the first axis direction by a sixth guide member fixed to the other edge of the table in the second axis direction.

The second driver is connected to the one edge of the table in the second axis direction while an auxiliary guide including the fifth linear bearing, the third rotary bearing, and the sixth linear bearing is provided on the other edge of the table in the second axis direction, thereby preventing the insufficient accuracy in positioning the table in the direction of rotation about the central axis of the table when the table moves in the first axis direction.

According to the first aspect of the present invention, one of the at least two second drivers may be connected to the one edge of the table in the second axis direction, and the other of the at least two second drivers may be connected to the other edge of the table in the second axis direction.

The one of the second drivers is connected to the one edge of the table in the second axis direction while the other of the second drivers is connected to the other edge of the table in the second axis direction, thereby preventing the insufficient positioning accuracy of the table apparatus, and preventing the table apparatus from upsizing and from having a more complex structure.

According to the first aspect of the present invention, the table apparatus may further include a plane guide that is disposed between a lower surface of the table and a guide surface of the base member, and guides the table in a direction parallel to the predetermined plane in a state where the lower surface of the table faces the guide surface of the base member through a gap.

The table can thus move smoothly in a horizontal direction.

According to the first aspect of the present invention, the plane guide may include a slide member in a rod shape. The table apparatus may further include a guide bearing that is supported by the table and movably supports the slide member in a third axis direction parallel to the third axis.

This allows the plane guide to move upward relative to the table when the table moves downward such that the lower surface of the table comes into contact with an upper surface of the base member in a state where the plane guide is in contact with the upper surface of the base member.

According to the first aspect of the present invention, the table apparatus may further include a drive element that moves the plane guide in the third axis direction.

As a result, a load acting on the plane guide in the third axis direction is adjusted. For example, an excessive load acting on the plane guide is prevented.

According to the first aspect of the present invention, the table apparatus may further include a preload device that applies force in advance to the table in a direction of rotation about the central axis of the table.

This causes a moment to constantly act on the table in the direction of rotation, and eliminates play in a mechanism of the table apparatus, thereby preventing the insufficient positioning accuracy.

According to the first aspect of the present invention, the preload device may include: a preload actuator that is supported by the base member and generates power for moving the table in the second axis direction; and a preload movable member that is coupled to the table and moves along a preload drive axis parallel to the second axis by actuation of the preload actuator. The preload device may be provided such that, in the first axis direction, a position of the central axis of the table differs from a position of the preload drive axis.

As a result, the force generated by the preload actuator can cause the moment to smoothly act on the table.

According to the first aspect of the present invention, the preload movable member may include: a seventh linear bearing that is guided by a seventh guide member provided on the base member and moves along the preload drive axis; a fourth rotary bearing that is disposed around a fourth rod member fixed to the seventh linear bearing and is rotatable relative to the fourth rod member about a central axis of the fourth rod parallel to the third axis; and an eighth linear bearing that is connected to the fourth rotary bearing and is guided in the first axis direction by an eighth guide member fixed to an edge of the table in the second axis direction.

Thus, even when the table rotates about the central axis of the table, the relative rotation between the fourth rod member and the fourth rotary bearing prevents a moment from acting on the eighth linear bearing and the eighth guide member. This prevents the insufficient positioning accuracy of the table apparatus.

According to the first aspect of the present invention, the preload device may comprise at least two preload devices, and the at least two preload devices may be provided such that, in the first axis direction, the position of the central axis of the table differs from a position of each preload drive axis. The at least two preload devices may each apply different force to the table.

As a result, the two preload devices can each apply different force to a different position of the table, and thus can apply a moment to the table while preventing the insufficient accuracy in positioning the table in the direction of rotation.

According to a second aspect of the present invention, there is provided a positioning apparatus that includes the table apparatus of the first aspect, and determines a position of a workpiece supported on the table of the table apparatus.

According to the second aspect of the present invention, the insufficient accuracy in positioning a workpiece supported on the table is prevented.

According to a third aspect of the present invention, there is provided a flat panel display manufacturing apparatus that includes: the table apparatus according to the first aspect; and a processing unit that processes a workpiece supported on the table.

According to the third aspect of the present invention, the flat panel display manufacturing apparatus can process the workpiece positioned by the table, thereby preventing a defective product from being manufactured from the workpiece. The flat panel display manufacturing apparatus includes a bonding device that bonds two substrates together, for example, and is used in at least a part of processes of manufacturing a flat panel display. The flat panel display includes at least one of a liquid crystal display, a plasma display, and an organic EL display.

According to a fourth aspect of the present invention, there is provided a precision machine that includes: the table apparatus according to the first aspect; and a processing unit that processes a workpiece supported on the table.

According to the fourth aspect of the present invention, the precision machine can process the workpiece positioned by the table, thereby preventing a defective product from being manufactured from the workpiece. The precision machine includes, for example, one or both of a precision measuring instrument and a precision processing machine. The precision measuring instrument can measure the workpiece positioned by the table, and thus can measure the workpiece with precision. The precision processing machine can machine the workpiece positioned by the table, and thus can machine the workpiece with precision.

According to the aspects of the present invention, there are provided the table apparatus, the positioning apparatus, the flat panel display manufacturing apparatus, and the precision machine, which can prevent the insufficient positioning accuracy.

BRIEF DESCRIPTION OF THE DRAWINGS

FIGS. 5A and 5B are diagrams each illustrating the operation of the table apparatus according to the comparative example.

DETAILED DESCRIPTION

The following describes embodiments of the present invention with reference to the drawings, but the present invention is not limited to the embodiments. Components in the following embodiments can be combined as appropriate, and a part of the components may not be used in some cases.

The following describes a positional relationship of various components by setting and referencing an XYZ orthogonal coordinate system. A direction parallel to a first axis in a predetermined plane is defined as an X axis direction (a first axis direction). A direction parallel to a second axis orthogonal to the first axis in the predetermined plane is defined as a Y axis direction (a second axis direction). A direction parallel to a third axis orthogonal to the predetermined plane is defined as a Z axis direction (a third axis direction). A direction of rotation (inclination) about the X axis (first axis) is defined as a θX direction. A direction of rotation (inclination) about the Y axis (second axis) is defined as a θY direction. A direction of rotation (inclination) about the Z axis (third axis) is defined as a θZ direction. The predetermined plane includes an XY plane. In the embodiments, the predetermined plane is parallel to a horizontal plane. The Z axis direction is a vertical direction. The X axis is orthogonal to a YZ plane. The Y axis is orthogonal to an XZ plane. The Z axis is orthogonal to the XY plane. The XY plane includes the X axis and the Y axis. The XZ plane includes the X axis and the Z axis. The YZ plane includes the Y axis and the Z axis.

First Embodiment

Figure 1:
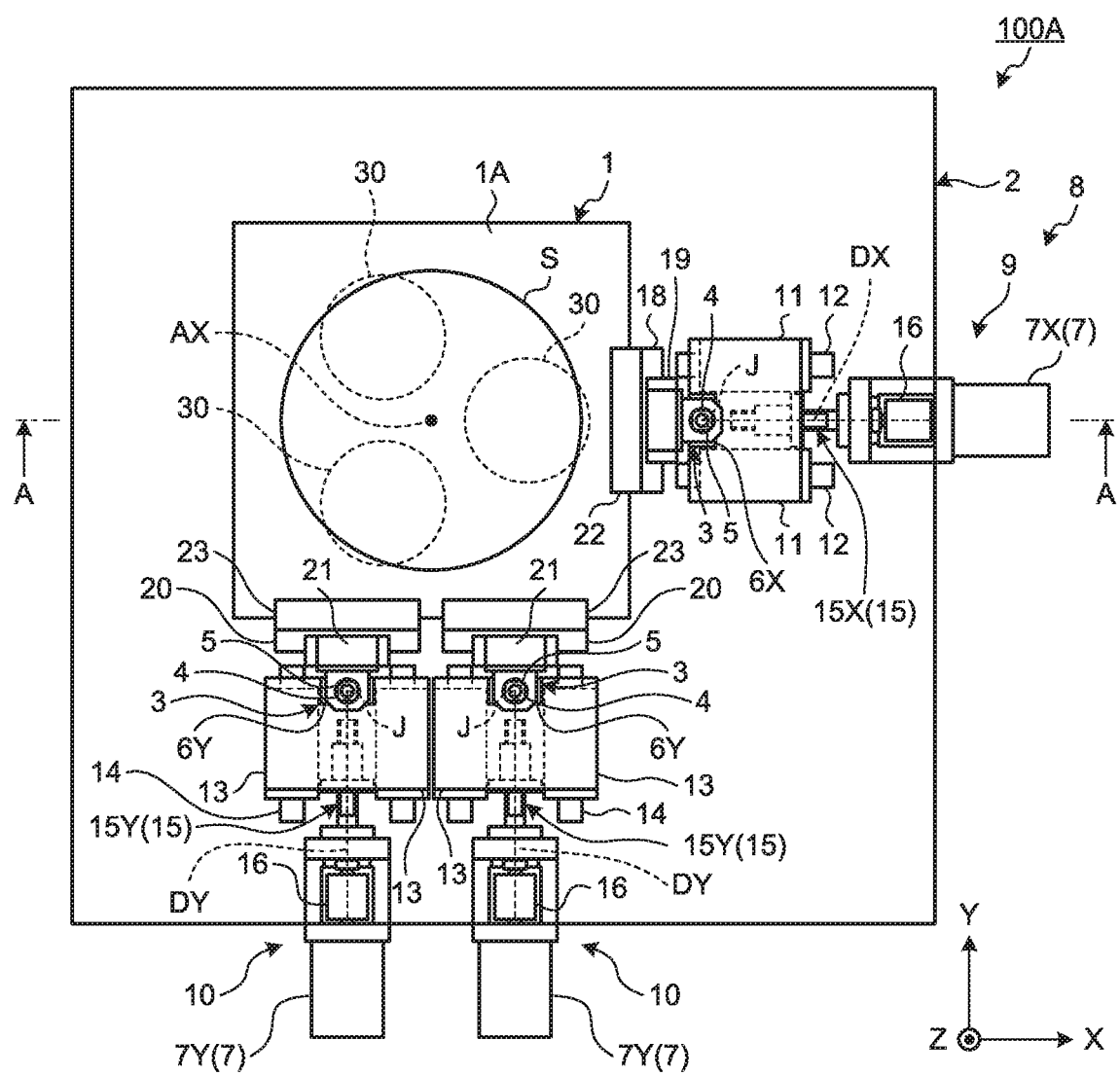
FIG. 1 is a plan view illustrating an example of a table apparatus according to a first embodiment.
Figure 2:
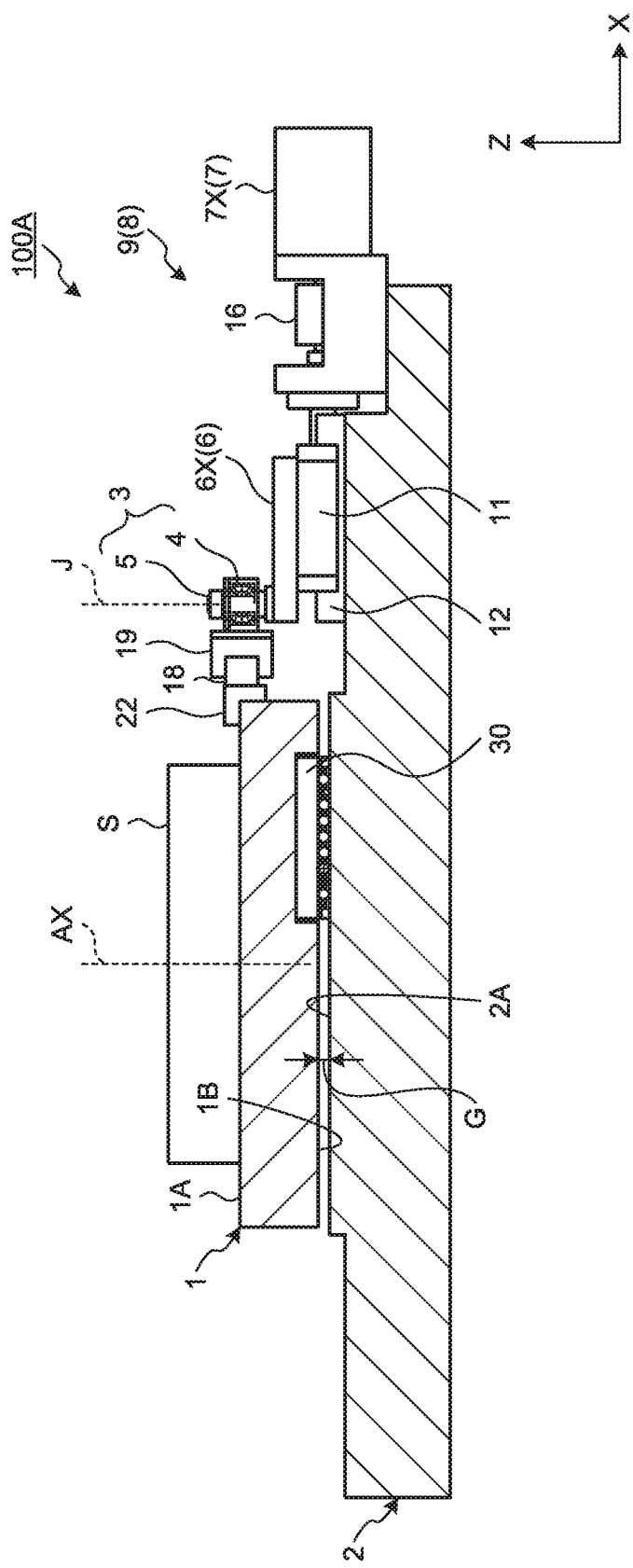
FIG. 2 is a side cross-sectional view illustrating an example of the table apparatus according to the first embodiment.

A first embodiment will be described. FIG. 1 is a plan view illustrating an example of a table apparatus 100A according to the present embodiment. FIG. 2 is a side cross-sectional view illustrating an example of the table apparatus 100A according to the present embodiment. FIG. 2 is a diagram viewing from the arrow direction of a line A-A of FIG. 1.

As illustrated in FIGS. 1 and 2, the table apparatus 100A includes: a table 1 having an upper surface 1A and a lower surface 1B; a base member 2 having an upper surface 2A that faces the lower surface 1B of the table 1; and a moving system 8 having an actuator 7 that can move the table 1.

The table 1 supports a workpiece S. The workpiece S is supported on the upper surface 1A of the table 1. The table 1 is movably supported by the base member 2. The upper surface 2A of the base member 2 is parallel to the XY plane. The upper surface 2A of the base member 2 is a guide surface that guides the table 1 in the XY plane. The table 1 is movable in three directions while being supported on the base member 2, the three directions being the X axis direction, the Y axis direction, and the direction of rotation (the θZ direction) about a central axis AX of the table parallel to the Z axis. The central axis AX of the table passes through the center of gravity of the table 1.

The table apparatus 100A also includes a plane guide 30 that is disposed between the lower surface 1B of the table 1 and the upper surface (guide surface) 2A of the base member 2 to guide the table 1 in a direction parallel to the XY plane in a state where the lower surface 1B of the table 1 and the upper surface 2A of the base member 2 face each other with a gap G therebetween. The plane guide 30 has a plurality of balls that can roll while being in contact with the upper surface 2A. The balls being in contact with the upper surface 2A maintains the gap G between the lower surface 1B of the table 1 and the upper surface (guide surface) 2A of the base member 2. The plane guide 30 may include a static pressure gas bearing.

The table apparatus 100A functions as a positioning apparatus that determines the position of the workpiece S. A positioning apparatus including the table apparatus 100A determines the position of the workpiece S supported on the table 1. The table apparatus may be referred to as the positioning apparatus.

The moving system 8 includes a first driver 9 that applies force in the X axis direction to the table 1, and a second driver 10 that applies force in the Y axis direction to the table 1. The first driver 9 and the second driver 10 are supported by the base member 2.

The first driver 9 includes a first actuator 7X that is supported by the base member 2 and generates power for moving the table 1 in the X axis direction, and a first movable member that is coupled to the table 1 and moves along a first drive axis DX parallel to the X axis by the actuation of the first actuator 7X.

The second driver 10 includes a second actuator 7Y that is supported by the base member 2 and generates power for moving the table 1 in the Y axis direction, and a second movable member that is coupled to the table 1 and moves along a second drive axis DY parallel to the Y axis by the actuation of the second actuator 7Y.

As illustrated in FIG. 1, only one first driver 9 is provided such that the position of the central axis AX of the table corresponds with the position of the first drive axis DX in the Y axis direction. At least two second drivers 10 are provided such that the position of the central axis AX of the table differs from the positions of the second drive axes DY in the X axis direction.

In the present embodiment, the one first driver 9 is coupled to an edge of the table 1 on a +X side. The two second drivers 10 are coupled to an edge of the table 1 on a −Y side.

The actuator 7 of the moving system 8 includes the first actuator 7X and the second actuator 7Y. The actuator 7 of the present embodiment includes a servomotor.

The moving system 8 has a ball screw mechanism 15 connected to the actuator 7. The ball screw mechanism 15 includes a first ball screw mechanism 15X connected to the first actuator 7X and a second ball screw mechanism 15Y connected to the second actuator 7Y. The first ball screw mechanism 15X includes a ball screw that rotates by power generated by the first actuator 7X and a nut disposed around the ball screw. The second ball screw mechanism 15Y includes a ball screw that rotates by power generated by the second actuator 7Y and a nut disposed around the ball screw. The actuator 7 and the ball screw mechanism 15 are connected via a coupling 16.

The first driver 9 includes: the first actuator 7X; a first linear bearing 11 that is connected to the nut of the first ball screw mechanism 15X and is movable along the first drive axis DX; a first guide member 12 that is provided on the base member 2 and guides the first linear bearing 11 in the X axis direction; a second linear bearing 19 that is guided in the Y axis direction by a second guide member 18 fixed to the edge of the table 1 on the +X side via a connecting member 22; and a coupler 3 that couples the first linear bearing 11 and the second linear bearing 19 to each other.

The second driver 10 includes: the second actuator 7Y; a third linear bearing 13 that is connected to the nut of the second ball screw mechanism 15Y and is movable along the second drive axis DY; a third guide member 14 that is provided on the base member 2 and guides the third linear bearing 13 in the Y axis direction; a fourth linear bearing 21 that is guided in the X axis direction by a fourth guide member 20 fixed to the edge of the table 1 on the −Y side via a connecting member 23; and the coupler 3 that couples the third linear bearing 13 and the fourth linear bearing 21 to each other.

The coupler 3 of the first driver 9 includes a rod member 5 fixed to the first linear bearing 11, and a rotary bearing 4 that is disposed around the rod member 5 and can rotate relative to the rod member 5 in the θZ direction about a central axis J of the rod parallel to the Z axis. In the present embodiment, a first support member 6X is fixed to the first linear bearing 11. The rod member 5 is fixed to the first support member 6X. The rod member 5 is provided so as to protrude upward from an upper surface of the first support member 6X. The rotary bearing 4 is connected to the second linear bearing 19.

The coupler 3 of the second driver 10 includes the rod member 5 fixed to the third linear bearing 13, and the rotary bearing 4 that is disposed around the rod member 5 and can rotate relative to the rod member 5 in the θZ direction about the central axis J of the rod parallel to the Z axis. In the present embodiment, a second support member 6Y is fixed to the third linear bearing 13. The rod member 5 is fixed to the second support member 6Y. The rod member 5 is provided so as to protrude upward from an upper surface of the second support member 6Y. The rotary bearing 4 is connected to the fourth linear bearing 21.

The actuation of the first actuator 7X causes the ball screw of the first ball screw mechanism 15X to rotate. As a result, the first linear bearing 11 moves in the X axis direction. The first linear bearing 11 is guided in the X axis direction by the first guide member 12 provided on the base member 2, and moves along the first drive axis DX. As the first linear bearing 11 moves, the rod member 5 fixed to the first linear bearing 11 via the first support member 6X moves in the X axis direction together with the first linear bearing 11. As the rod member 5 moves, the rotary bearing 4 disposed around the rod member 5 moves in the X axis direction together with the rod member 5. As the rotary bearing 4 moves, the second linear bearing 19 connected to the rotary bearing 4 moves in the X axis direction together with the rotary bearing 4. As the second linear bearing 19 moves, the table 1 connected to the second linear bearing 19 via the second guide member 18 and the connecting member 22 moves in the X axis direction together with the second linear bearing 19.

The actuation of the second actuator 7Y causes the ball screw of the second ball screw mechanism 15Y to rotate. As a result, the third linear bearing 13 moves in the Y axis direction. The third linear bearing 13 is guided in the Y axis direction by the third guide member 14 provided on the base member 2, and moves along the second drive axis DY. As the third linear bearing 13 moves, the rod member 5 fixed to the third linear bearing 13 via the second support member 6Y moves in the Y axis direction together with the third linear bearing 13. As the rod member 5 moves, the rotary bearing 4 disposed around the rod member 5 moves in the Y axis direction together with the rod member 5. As the rotary bearing 4 moves, the fourth linear bearing 21 connected to the rotary bearing 4 moves in the Y axis direction together with the rotary bearing 4. As the fourth linear bearing 21 moves, the table 1 connected to the fourth linear bearing 21 via the fourth guide member 20 and the connecting member 23 moves in the Y axis direction together with the fourth linear bearing 21.

The moving system 8 can thus move the table 1 in the X axis direction by actuating the first actuator 7X of the first driver 9. Likewise, the moving system 8 can move the table 1 in the Y axis direction by actuating the second actuator 7Y of the second driver 10. The moving system 8 can also rotate the table 1 in the θZ direction (direction of rotation) by varying the amount of actuation of the second actuators 7Y of the plurality of (two) second drivers 10.

In the present embodiment, the first movable member that is coupled to the table 1 and moves along the first drive axis DX by the actuation of the first actuator 7X includes: the first linear bearing 11; the coupler 3 including the rod member 5 and the rotary bearing 4; and the second linear bearing 19. The second movable member that is coupled to the table 1 and moves along the second drive axis DY by the actuation of the second actuator 7Y includes: the third linear bearing 13; the coupler 3 including the rod member 5 and the rotary bearing 4; and the fourth linear bearing 21.

Figure 3:
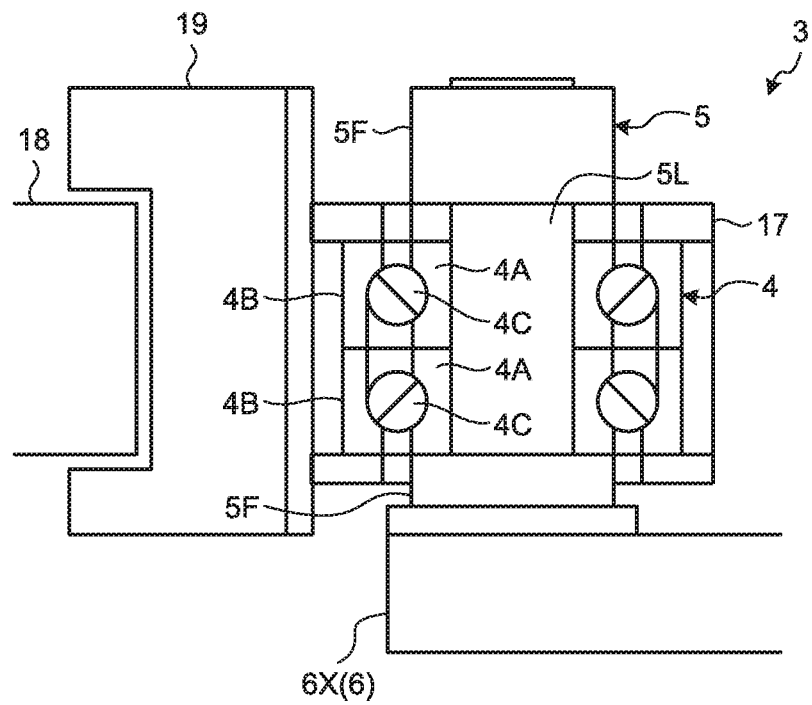
FIG. 3 is a diagram illustrating an example of a coupler according to the first embodiment.

FIG. 3 is a diagram illustrating an example of the coupler 3 of the first driver 9 according to the present embodiment. As illustrated in FIG. 3, the coupler 3 includes: the rod member 5 provided so as to protrude upward from the upper surface of the first support member 6X fixed to the first linear bearing 11; and the rotary bearing 4 disposed around the rod member 5.

The rod member 5 has a rod portion 5L and a flange portion 5F disposed on each of an upper end and a lower end of the rod portion 5L.

The rotary bearing 4 is substantially cylindrical. The rotary bearing 4 is disposed around the rod portion 5L. The rotary bearing 4 is supported by a casing 17. The second linear bearing 19 is connected to the rotary bearing 4 via the casing 17.

The rotary bearing 4 includes a ball bearing. The rotary bearing 4 includes: an inner ring 4A disposed to be in contact with the rod portion 5L; an outer ring 4B disposed around the inner ring 4A; and a ball 4C disposed between the inner ring 4A and the outer ring 4B. In the present embodiment, two ball bearings each including the inner ring 4A, the outer ring 4B, and the ball 4C are disposed along the vertical direction (the direction parallel to a central axis of the rod portion 5L).

The rotary bearing 4 allows the rod member 5 to move in the vertical direction. The amount of preload applied to the rotary bearing 4 is adjusted to allow the movement of the rod member 5 in the vertical direction. The rod member 5 is supported by the rotary bearing 4 to be able to move in the vertical direction. In the present embodiment, the table 1 is movable in the vertical direction with respect to the first driver 9 and a support member 6. In other words, the displacement of the table 1 is allowed in the vertical direction with respect to the first driver 9 and the support member 6. However, when a problem occurs in which the positioning accuracy of the table 1 in the X axis direction is decreased due to the rotary bearing 4 that allows the movement of the rod member 5 in the vertical direction, a needle bearing to which preload is applied to have no gap in a radial direction may be used to allow the movement of the rod member 5 in the vertical direction. Alternatively, when the amount of movement of the rod member 5 is small, the movement of the rod member 5 in the vertical direction may be allowed by the axial rigidity of the rotary bearing 4. Still alternatively, the movement of the rod member 5 in the vertical direction may be allowed by the rotation in the θY direction of a bearing unit formed of the rotary bearings 4 that are duplexed face to face, and the rotation of the first linear bearing 11 in the θY direction.

The coupler 3 of the second driver 10 has a structure equivalent to that of the coupler 3 of the first driver 9. The description of the coupler 3 of the second driver 10 will be omitted.

Next, an example of the operation of the table apparatus 100A according to the present embodiment will be described. The moving system 8 adjusts the position in the XY plane of the workpiece S supported on the table 1. When adjusting the position of the workpiece S in the X axis direction, the moving system 8 actuates the first actuator 7X of the first driver 9. When adjusting the position of the workpiece S in the Y axis direction, the moving system 8 actuates the second actuator 7Y of the second driver 10. When adjusting the position of the workpiece S in the θZ direction, the moving system 8 actuates the two second actuators 7Y of the two second drivers 10 by varying the amount of actuation of the second actuators 7Y.

In the present embodiment, the first driver 9 is provided such that the position of the central axis AX of the table is aligned with the position of the first drive axis DX in the Y axis direction. The first drive axis DX includes the point of the table 1 to which force is applied by the first driver 9. In the present embodiment, the first drive axis DX includes a central axis of the ball screw of the first ball screw mechanism 15X and is parallel to the X axis. The position of the first drive axis DX is aligned with the central axis of the rotary bearing 4 (the central axis J of the rod) in the Y axis direction. The position of the central axis AX of the table is aligned with the position of the first drive axis DX in the Y axis direction, thereby preventing interference between the second linear bearing 19 and the second guide member 18 of the first driver 9, even when the table 1 rotates in the θZ direction about the central axis AX of the table. This allows the second guide member 18 to maintain smooth guiding of the second linear bearing 19. As a result, the insufficient positioning accuracy of the table apparatus 100A is prevented.

In the present embodiment, the two second drivers 10 are provided such that the position of the central axis AX of the table differs from the positions of the second drive axes DY with in the X axis direction. The second drive axis DY includes the point of the table 1 to which force is applied by the second driver 10. In the present embodiment, the second drive axis DY includes the central axis of the ball screw of the second ball screw mechanism 15Y and is parallel to the Y axis. The position of the second drive axis DY is aligned with the central axis of the rotary bearing 4 (the central axis J of the rod) in the X axis direction. The difference between the position of the central axis AX of the table and the positions of the second drive axes DY in the X axis direction allows the table 1 to move in the Y axis direction and rotate in the θZ direction.

When the table 1 rotates in the θZ direction about the central axis AX of the table, the position of the central axis AX of the table deviates (is offset) from the position of the first drive axis DX in the Y axis direction, and the offset may cause a moment to act on the second linear bearing 19 and the second guide member 18. In the present embodiment, the coupler 3 including the rotary bearing 4 is disposed between the first linear bearing 11 that is coupled to the first actuator 7X and moves in the X axis direction and the second linear bearing 19 that is coupled to the table 1 and moves in the Y axis direction. The first linear bearing 11 and the second linear bearing 19 are coupled via the coupler 3 including the rotary bearing 4. Thus, even when the table 1 rotates in the θZ direction about the central axis AX of the table, the relative rotation between the rod member 5 and the rotary bearing 4 of the coupler 3 prevents the moment from acting on the second linear bearing 19 and the second guide member 18. This reduces a positioning error of the table apparatus 100A, and makes it easier for the first driver 9 to calculate a positional correction amount for avoiding the interference.

Figure 4:
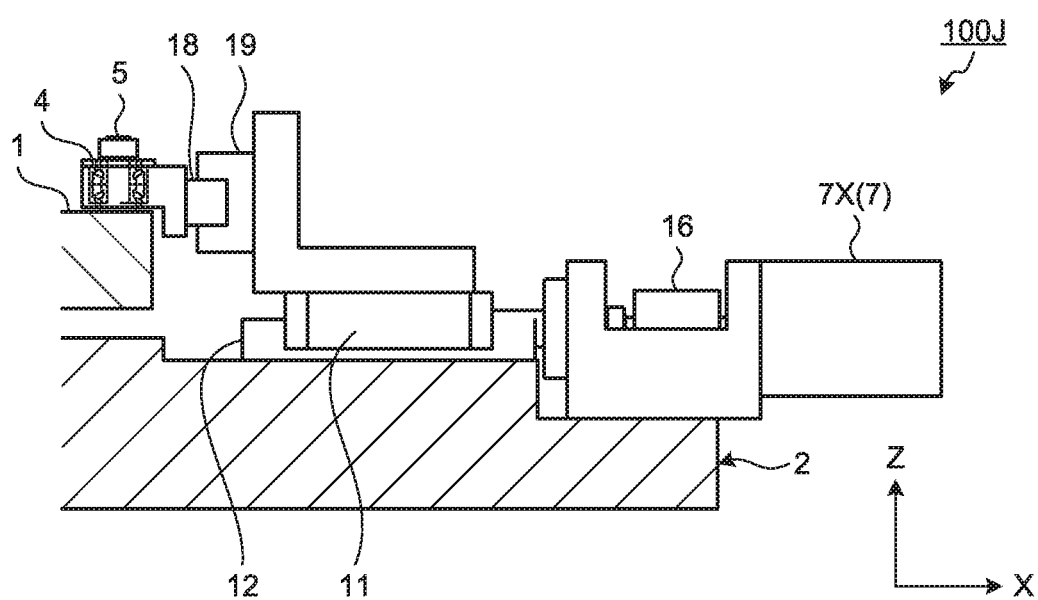
FIG. 4 is a diagram illustrating a table apparatus according to a comparative example.

FIG. 4 is a diagram illustrating a table apparatus 100J according to a comparative example. In the table apparatus 100J illustrated in FIG. 4, the rod member 5 is fixed to the table 1, and the rotary bearing 4 is disposed around the rod member 5. The rotary bearing 4 is connected to the second guide member 18, and the second linear bearing 19 and the first linear bearing 11 are fixed to each other.

FIGS. 5A and 5B are diagrams each illustrating an example of the operation of the table apparatus 100J according to the comparative example. When the table 1 rotates in the θZ direction from a state illustrated in FIG. 5A, the position of the central axis AX of the table deviates (or is offset) from the position of the first drive axis DX in the Y axis direction as illustrated in FIG. 5B. In order to reduce the moment acting on the second linear bearing 19 and the second guide member 18 in the state illustrated in FIG. 5B, the position of the second linear bearing 19 in the X axis direction needs to be corrected by actuating the first actuator 7X of the first driver 9 in consideration of an offset amount OF between the central axis AX of the table and the first drive axis DX.

In the table apparatus 100J according to the comparative example, the calculation of the positional correction amount for correcting the position of the second linear bearing 19 in the X axis direction may become complicated. For example, the amount of movement of the table 1 in the Y axis direction by the second driver 10 needs to be included in the calculation of the positional correction amount. Employing the structure of the table apparatus 100A according to the present embodiment simplifies the calculation of the positional correction amount.

Figure 6:
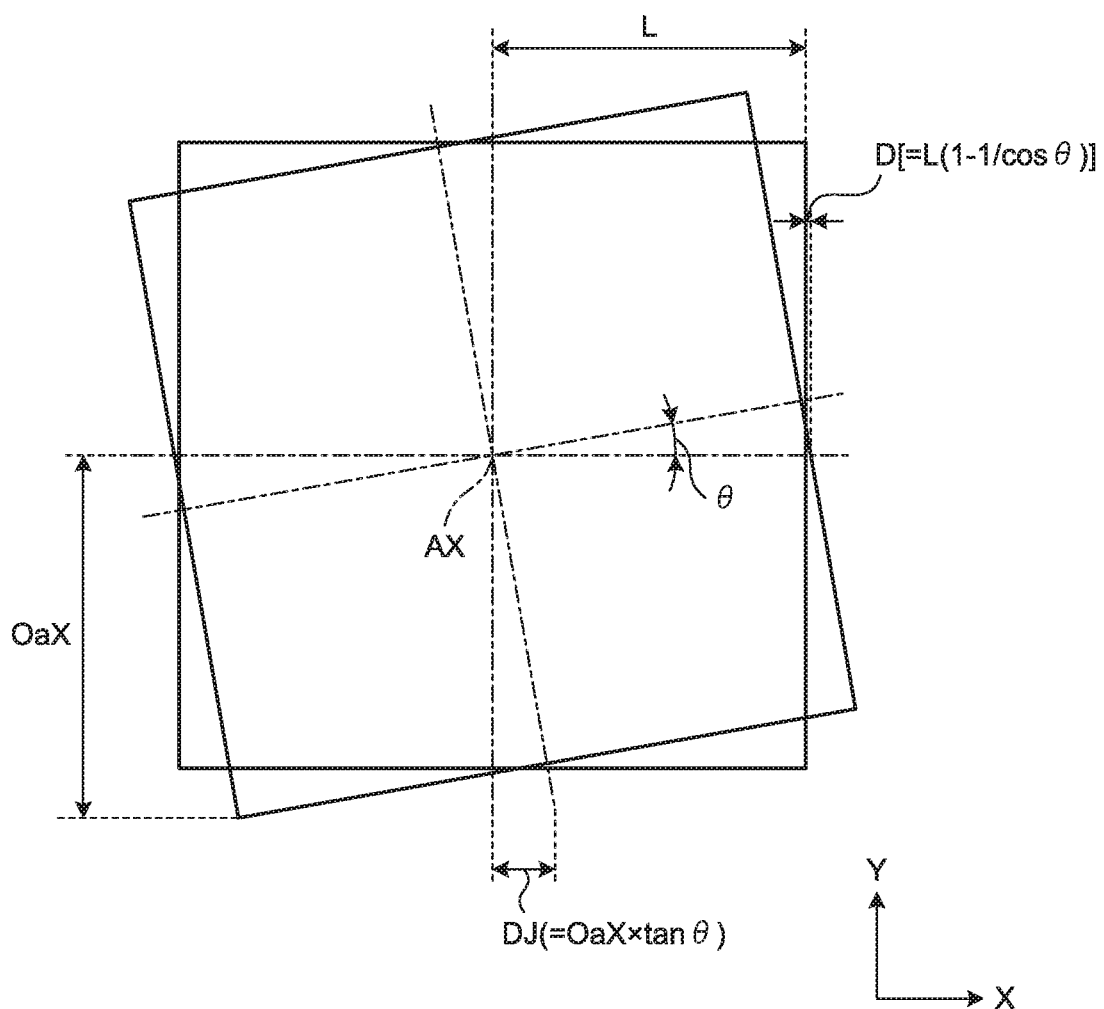
FIG. 6 is a schematic diagram comparing a positional correction amount for a table apparatus having a conventional structure with a positional correction amount for the table apparatus according to the first embodiment.

FIG. 6 is a schematic diagram comparing a positional correction amount by an actuator of a table apparatus having a conventional structure as disclosed in JP 2012-112715 A, for example, with the positional correction amount by the first actuator 7X of the table apparatus 100A according to the present embodiment. FIG. 6 is a view schematically illustrating the table, which rotates by an angle θ about the central axis AX of the table.

In the case of the table apparatus having the conventional structure, the table needs to be moved by [OaX×tan θ] as a positional correction amount DJ. On the other hand, in the case of the table apparatus 100A according to the present embodiment, the table only needs to be moved by [L(1−1/cos θ)] as a positional correction amount D. The positional correction amount can be ignored when the angle θ is minute. However, the correction is needed depending on the balance among the offset amount OF, the amount of rotation of the table, and the positioning accuracy. In order to obtain a positioning accuracy of 1 [μm] with an amount of rotation of 0.1 [°], for example, the offset amount OF needs to be 0.57 [mm] or less, namely zero in design, and be reduced to an error level caused by processing of parts or due to an assembly tolerance to obtain the positional correction amount of 1 [μm] or less.

As described above, according to the present embodiment, the table 1 can move in the three directions, i.e., the X axis direction, the Y axis direction, and the direction of rotation about the central axis AX of the table by one first driver 9 and at least two second drivers 10. The first driver 9 is provided such that the position of the central axis AX of the table is aligned with the position of the first drive axis DX in the Y axis direction, thereby preventing the interference between the second guide member 18 fixed to the edge of the table 1 in the X axis direction and the second linear bearing 19 when the table 1 rotates. The first linear bearing 11 that moves along the first drive axis DX on the base member 2 and the second linear bearing 19 that is fixed to the table 1 and moves in the Y axis direction are coupled to each other via the rod member 5 and the rotary bearing 4 of the first driver 9. Thus, even when the table 1 rotates about the central axis AX of the table, the relative rotation between the rod member 5 and the rotary bearing 4 of the first driver 9 prevents the moment from acting on the second linear bearing 19 and the second guide member 18. As a result, the insufficient positioning accuracy of the table apparatus 100A is prevented.

In the present embodiment, the third linear bearing 13 that moves along the second drive axis DY on the base member 2 and the fourth linear bearing 21 that is fixed to the table 1 and moves in the X axis direction are coupled to each other via the rod member 5 and the rotary bearing 4 of the second driver 10. Thus, even when the table 1 rotates about the central axis AX of the table, the relative rotation between the rod member 5 and the rotary bearing 4 of the second driver 10 prevents the moment from acting on the fourth linear bearing 21 and the fourth guide member 20. As a result, the insufficient positioning accuracy of the table apparatus 100A is prevented.

Second Embodiment

A second embodiment will be described. In the following description, a component identical or equivalent to that in the aforementioned embodiment is denoted by the same reference numeral as that used in the aforementioned embodiment, and the description of such a component will be simplified or omitted.

Figure 7:
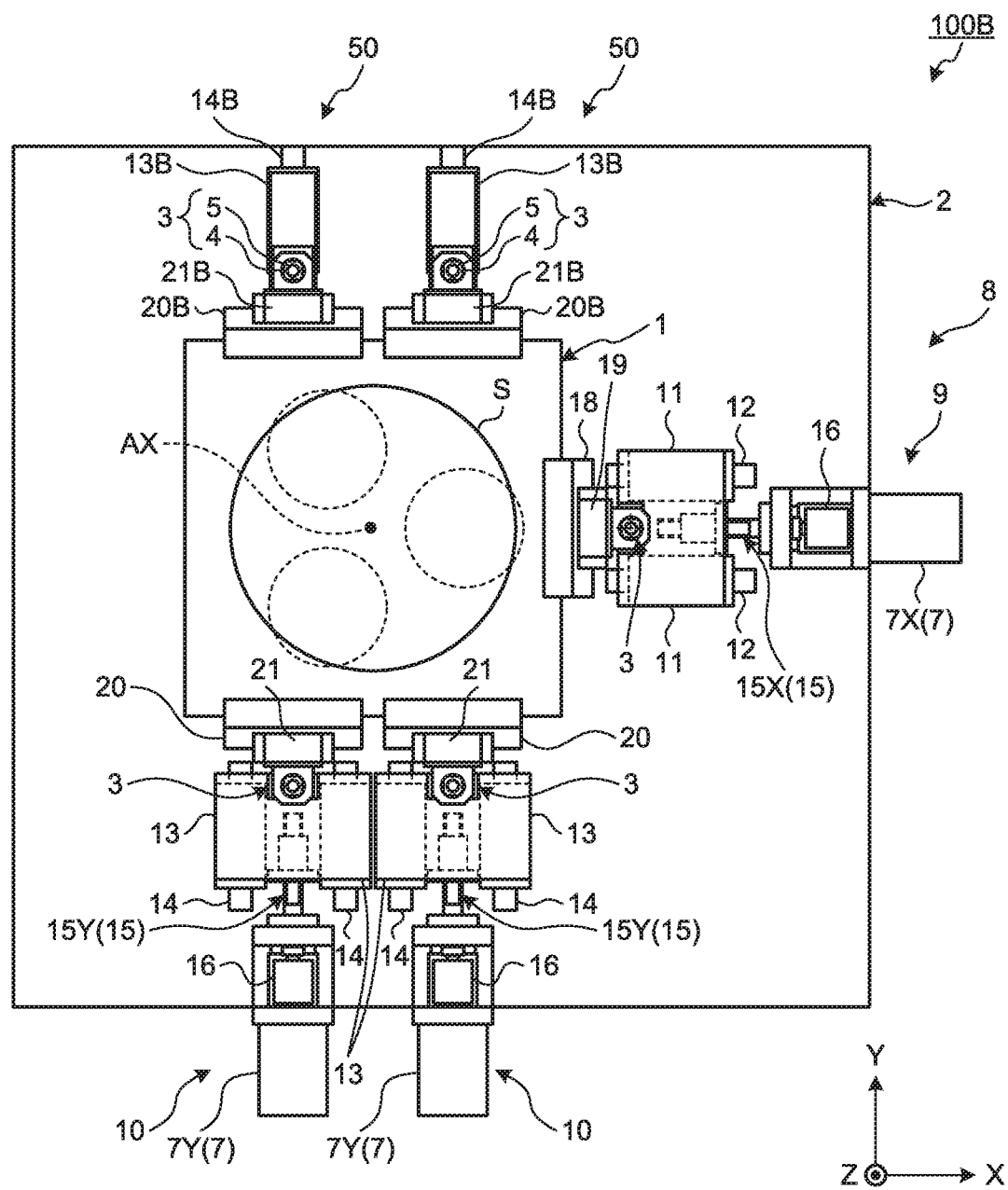
FIG. 7 is a plan view illustrating an example of a table apparatus according to a second embodiment.

FIG. 7 is a plan view illustrating an example of a table apparatus 100B according to the present embodiment. The table apparatus 100B according to the present embodiment is characterized in that an auxiliary guide 50 is provided in the table apparatus 100A described in the aforementioned embodiment.

The table apparatus 100B includes: one first driver 9 connected to the edge of the table 1 on the +X side; two second drivers 10 connected to the edge of the table 1 on the −Y side; and two auxiliary guides 50 connected to the edge of the table 1 on a +Y side.

The auxiliary guide 50 includes: a fifth linear bearing 13B that is guided by a fifth guide member 14B provided on the base member 2, and moves in the Y axis direction; the rotary bearing 4 that is disposed around the rod member 5 fixed to the fifth linear bearing 13B, and can rotate relative to the rod member 5 about the central axis J of the rod parallel to the Z axis; and a sixth linear bearing 21B that is connected to the rotary bearing 4, and is guided in the X axis direction by a sixth guide member 20B fixed to the edge of the table 1 on the +Y side.

That is, the auxiliary guide 50 has a structure in which the second actuator 7Y, the coupling 16, and the second ball screw mechanism 15Y are removed from the second driver 10. The fifth linear bearing 13B that moves in the Y axis direction and the sixth linear bearing 21B that moves in the X axis direction are coupled to each other by the coupler 3 including the rod member 5 and the rotary bearing 4.

The two second drivers 10 are disposed along the X axis direction in a space on the −Y side of the table 1. The two auxiliary guides 50 are disposed along the X axis direction in a space on the +Y side of the table 1.

The position in the X axis direction of one of the two second drivers 10 is aligned with the position in the X axis direction of one of the two auxiliary guides 50. The position in the X axis direction of the other of the two second drivers 10 is aligned with the position in the X axis direction of the other of the two auxiliary guides 50. That is, X coordinates of the couplers 3 (the central axes J of the rods) of the two second drivers 10 are the same as X coordinates of the couplers 3 (the central axes J of the rods) of the two auxiliary guides 50.

Also in the present embodiment, the actuation of the actuator 7 of the moving system 8 allows the table 1 to move in three directions, i.e., the X axis direction, the Y axis direction, and the θZ direction.

As described above, according to the present embodiment, the second drivers 10 are connected to the edge of the table 1 on the −Y side, and the auxiliary guides 50 are connected to the edge of the table 1 on the +Y side. This prevents the insufficient positioning accuracy of the table apparatus 100B in the direction of rotation about the central axis AX of the table when the table 1 moves in the X axis direction. In addition, friction of the same magnitude occurs at regular intervals as seen from the first actuator 7X, which can prevent the generation of a moment that leads to a positioning error in the θZ direction when the table 1 moves in the X axis direction.

Third Embodiment

A third embodiment will be described. In the following description, a component identical or equivalent to that in the aforementioned embodiment is denoted by the same reference numeral as that used in the aforementioned embodiment, and the description of such a component will be simplified or omitted.

Figure 8:
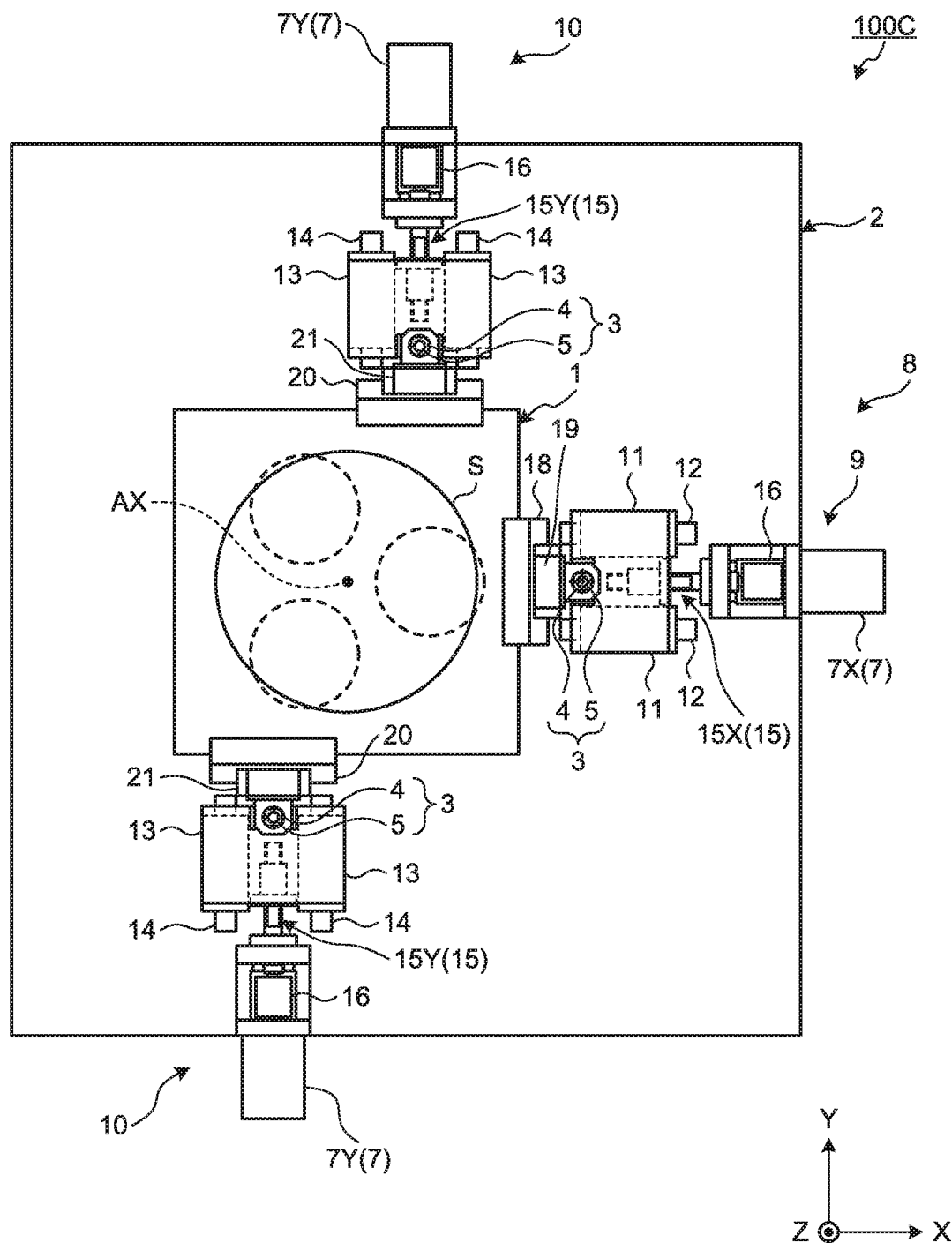
FIG. 8 is a plan view illustrating an example of a table apparatus according to a third embodiment.

FIG. 8 is a plan view illustrating an example of a table apparatus 100C according to the present embodiment. The table apparatus 100C according to the present embodiment is a modification of the table apparatus 100A described in the aforementioned embodiment.

As illustrated in FIG. 8, one of the two second drivers 10 is connected to the edge of the table 1 on the +Y side, and the other of the second drivers 10 is connected to the edge of the table 1 on the −Y side.

The position in the X axis direction of the second driver 10 disposed on the +Y side with respect to the central axis AX of the table 1 is different from the position in the X axis direction of the second driver 10 disposed on the −Y side with respect to the central axis AX of the table 1. That is, X coordinates of the couplers 3 (the central axes J of the rods) of the second drivers 10 disposed on both sides in the Y axis direction with respect to the central axis AX of the table 1 are different from each other.

The present embodiment also prevents the insufficient positioning accuracy of the table apparatus 100C, thereby preventing the table apparatus 100c from upsizing, and from having a more complex structure.

Fourth Embodiment

A fourth embodiment will be described. In the following description, a component identical or equivalent to that in the aforementioned embodiment is denoted by the same reference numeral as that used in the aforementioned embodiment, and the description of such a component will be simplified or omitted.

Figure 9:
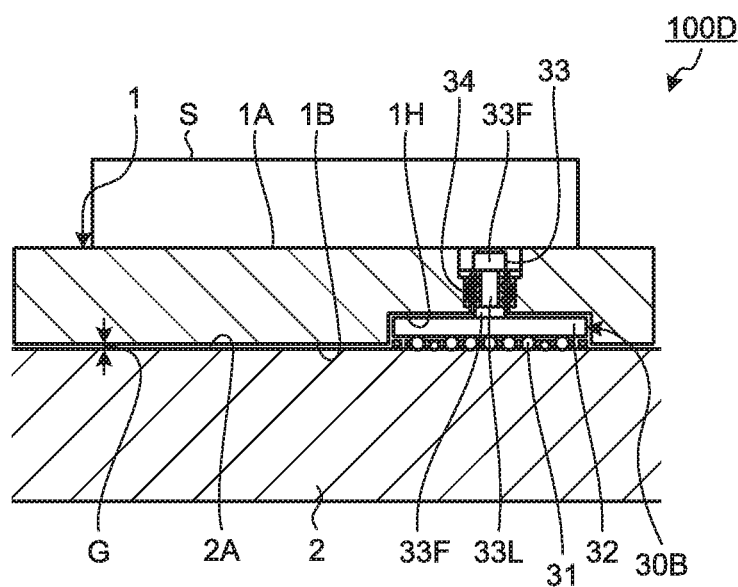
FIG. 9 is a side cross-sectional view illustrating an example of a table apparatus according to a fourth embodiment.

FIG. 9 is a side cross-sectional view illustrating a part of a table apparatus 100D according to the present embodiment. The present embodiment describes a plane guide 30B which is a modification of the plane guide 30.

The plane guide 30B is disposed between the lower surface 1B of the table 1 and the upper surface 2A of the base member 2, and guides the table 1 in a direction parallel to the XY plane in a state where the lower surface 1B of the table 1 and the upper surface 2A of the base member 2 face each other with the gap G therebetween.

The plane guide 30B is disposed in an internal space 1H formed in the table 1. The plane guide 30B includes a support plate 32 that supports a plurality of balls 31, and a rod-like slide member 33 connected to the support plate 32. The balls 31 are disposed on a lower surface side of the support plate 32. The balls 31 are rotatably (rollably) supported by the support plate 32. The balls 31 of the plane guide 30B are disposed so as to at least partly protrude downward from the lower surface 1B of the table 1.

The moving system 8 is actuated to move the table 1 on the upper surface 2A of the base member 2. With the gap G being formed, the balls 31 of the plane guide 30B can roll while being in contact with the upper surface 2A of the base member 2. As a result, the table 1 is guided in at least one of the X axis direction parallel to the upper surface 2A, the Y axis direction, and the θZ direction.

The slide member 33 is fixed to an upper surface of the support plate 32. The slide member 33 is provided so as to protrude upward from the upper surface of the support plate 32. The slide member 33 has a rod portion 33L and a flange portion 33F disposed on each of upper and lower ends of the rod portion 33L.

In the present embodiment, the table apparatus 100D includes a guide bearing 34 that is supported by the table 1, and movably supports the slide member 33 in the Z axis direction.

Figure 10:
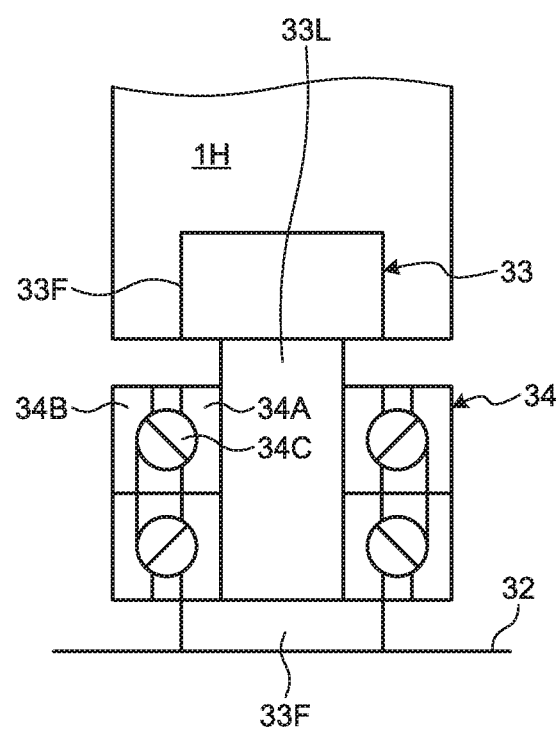
FIG. 10 is an enlarged view illustrating a region in proximity to a guide bearing according to the fourth embodiment.

FIG. 10 is an enlarged view illustrating a region in proximity to the guide bearing 24 according to the present embodiment. The guide bearing 34 is disposed around the rod portion 33L. The guide bearing 34 is supported by an inner surface of the table 1 in the internal space 1H.

The guide bearing 34 includes a ball bearing. The guide bearing 34 includes: an inner ring 34A disposed to be in contact with the rod portion 33L; an outer ring 34B disposed around the inner ring 34A; and a ball 34C disposed between the inner ring 34A and the outer ring 34B. In the present embodiment, two ball bearings each including the inner ring 34A, the outer ring 34B, and the ball 34C are disposed along the Z axis direction (the direction parallel to a central axis of the rod portion 33L).

The guide bearing 34 allows the slide member 33 (plane guide 30B) to move in the Z axis direction. The slide member 33 is supported by the guide bearing 34 to be able to move in the Z axis direction. The plane guide 30B of the present embodiment is movable in the Z axis direction with respect to the table 1. In other words, the displacement of the plane guide 30B is allowed in the Z axis direction with respect to the table 1.

A downward load in the vertical direction (−Z direction) may act on the table 1 in a process of manufacturing a device using the table apparatus 100D, for example. When the load acting on the table 1 in the Z axis direction is zero, the lower surface 1B of the table 1 and the upper surface 2A of the base member 2 face each other with the gap G therebetween. When the load acting on the table 1 in the Z axis direction is less than a predetermined value, the table 1 descends so as to reduce the dimension of the gap G. When the load acting on the table 1 in the Z axis direction is less than the predetermined value, the guide bearing 34 supports the table 1 such that the lower surface 1B of the table 1 does not come into contact with the upper surface 2A of the base member 2.

In the state where the load acting on the table 1 in the Z axis direction is less than the predetermined value and the gap G is formed, at least a part of the plane guide 30B supported by the table 1 is in contact with the upper surface 2A of the base member 2. When the moving system 8 is actuated to move the table 1 in the XY plane, the table 1 is guided on the upper surface 2A of the base member 2 via the plane guide 30B. The table 1 can thus move smoothly in the horizontal direction.

The guide bearing 34 allows the table 1 to move in the Z axis direction by the dimension of the gap G. The dimension of the gap G is a distance between the lower surface 1B and the upper surface 2A when the load acting on the table 1 in the Z axis direction is zero (when no load is applied). When the downward load in the vertical direction (−Z direction) acts on the table 1, the table 1 moves downward (in the −Z direction) while being guided by the guide bearing 34. As the table 1 moves downward, the lower surface 1B of the table 1 comes into contact with the upper surface 2A of the base member 2. When downward force in the vertical direction acting on the table 1 equals a predetermined value, the lower surface 1B of the table 1 comes into contact with the upper surface 2A of the base member 2. When the downward load in the vertical direction acting on the table 1 equals the predetermined value or more, the guide bearing 34 guides the table 1 in the Z axis direction such that the lower surface 1B of the table 1 comes into contact with the upper surface 2A of the base member 2. The lower surface 1B of the table 1 coming into contact with the upper surface 2A of the base member 2 allows the table 1 to be supported on the upper surface 2A of the base member 2.

The dimension of the gap G is determined such that the lower surface 1B comes into contact with the upper surface 2A before an excessive load (overload) acts on the guide bearing 34. In other words, the dimension of the gap G is determined such that an overload does not act on the guide bearing 34 when the table 1 moves in the vertical direction within a range of the dimension of the gap G. The state in which the overload acts on the guide bearing 34 refers to a state in which a load exceeding a static load rating acts on the guide bearing 34, and a state in which a load causing the ball 34C to run off a guide groove of the inner ring 34A and that of the outer ring 34B acts on the guide bearing 34, for example.

The predetermined value refers to a value of the load acting on the table 1 in the −Z direction when the load acting on the table 1 in the −Z direction makes the guide bearing 34 unable to maintain the position of the table 1 in the Z axis direction, thereby causing the table 1 to move in the −Z direction, the lower surface 1B of the table 1 to come into contact with the upper surface 2A of the base member 2, and the dimension of the gap G to equal zero. The table 1 does not move in the −Z direction when the load acting on the table 1 is zero (when no load is applied), so that the position of the table 1 in the Z axis direction is maintained and that the gap G between the lower surface 1B and the upper surface 2A is maintained. When the load acts on the table 1 in the −Z direction, the table 1 starts to move in the −Z direction. When the load acting on the table 1 is less than the predetermined value, the table 1 moves in the −Z direction to cause the dimension of the gap G to decrease gradually, but the lower surface 1B of the table 1 is separated from the upper surface 2A of the base member 2. Once the load acting on the table 1 reaches the predetermined value, the lower surface 1B of the table 1 that has moved in the −Z direction comes into contact with the upper surface 2A of the base member 2, whereby the dimension of the gap G equals zero.

The dimension of the gap G allowing the lower surface 1B to be in contact with the upper surface 2A before an overload acts on the guide bearing 34 as well as the predetermined value of the load can be obtained in advance by an experiment or a simulation. The dimension of the gap G appropriate for the guide bearing 34 to be used and the predetermined value of the load are determined according to the obtained data.

Similarly to the guide bearing 34, the rotary bearing 4 of the coupler 3 supports the table 1 such that the lower surface 1B of the table 1 does not come into contact with the upper surface 2A of the base member 2 when the load acting on the table 1 in the Z axis direction is less than the predetermined value. The rotary bearing 4 allows the table 1 to move in the Z axis direction by the dimension of the gap G. When the downward load in the vertical direction (−Z direction) acts on the table 1, the table 1 moves downward (in the −Z direction) while being guided by the rotary bearing 4. When the downward load in the vertical direction that is more than or equal to the predetermined value acts on the table 1, the rotary bearing 4 guides the table 1 in the Z axis direction such that the lower surface 1B of the table 1 comes into contact with the upper surface 2A of the base member 2.

In the present embodiment, the guide bearing 34 allows the slide member 33 (plane guide 30B) to move in the Z axis direction. When the downward load in the vertical direction that is more than or equal to the predetermined value acts on the table 1 to cause the table 1 to move downward, the plane guide 30B supported by the guide bearing 34 can move upward relative to the table 1. As a result, the plane guide 30B is entirely accommodated in the internal space 1H of the table 1.

In the present embodiment, the rigidity of the guide bearing 34 in the Z axis direction is smaller than the rigidity of the plane guide 30B in the Z axis direction. The downward movement of the table 1 causes an upward load in the vertical direction to act on the plane guide 30B. The dimension of the gap G is determined such that the lower surface 1B comes into contact with the upper surface 2A before an excessive load (overload) acts on the plane guide 30B. In other words, the dimension of the gap G is determined such that an overload does not act on the plane guide 30B when the table 1 moves in the vertical direction within the range of the dimension of the gap G.

As described above, according to the present embodiment, the plane guide 30B is provided so that the table 1 can move smoothly in the horizontal direction parallel to the upper surface 2A of the base member 2 in the state where the lower surface 1B of the table 1 and the upper surface 2A of the base member 2 face each other through the gap G therebetween.

Moreover, the plane guide 30B includes the rod-like slide member 33 in the present embodiment. The slide member 33 is supported so as to be able to move in the Z axis direction by the guide bearing 34 supported by the table 1. Thus, when the table 1 moves downward such that the lower surface 1B of the table 1 comes into contact with the upper surface 2A of the base member 2 in the state where the guide bearing 34 is in contact with the upper surface 2A of the base member 2, the plane guide 30B can move upward relative to the table 1. As a result, the plane guide 30B is accommodated in the internal space 1H of the table 1.

Fifth Embodiment

A fifth embodiment will be described. In the following description, a component identical or equivalent to that in the aforementioned embodiment is denoted by the same reference numeral as that used in the aforementioned embodiment, and the description of such a component will be simplified or omitted.

Figure 11:
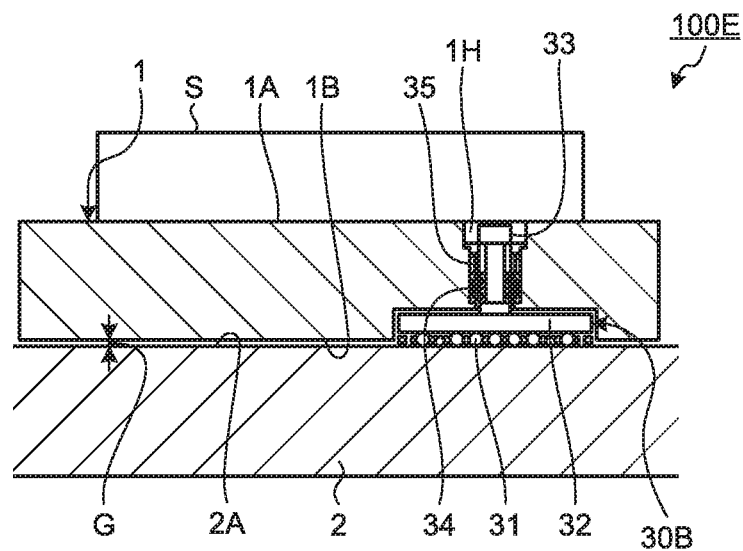
FIG. 11 is a side cross-sectional view illustrating an example of a table apparatus according to a fifth embodiment.

FIG. 11 is a side cross-sectional view illustrating an example of a table apparatus 100E according to the present embodiment. The most part of the table apparatus 100E according to the present embodiment is identical to the table apparatus 100D described in the aforementioned embodiment. In the present embodiment, the table apparatus 100E includes a drive element 35 that moves the plane guide 30B in the Z axis direction.

Figure 12:
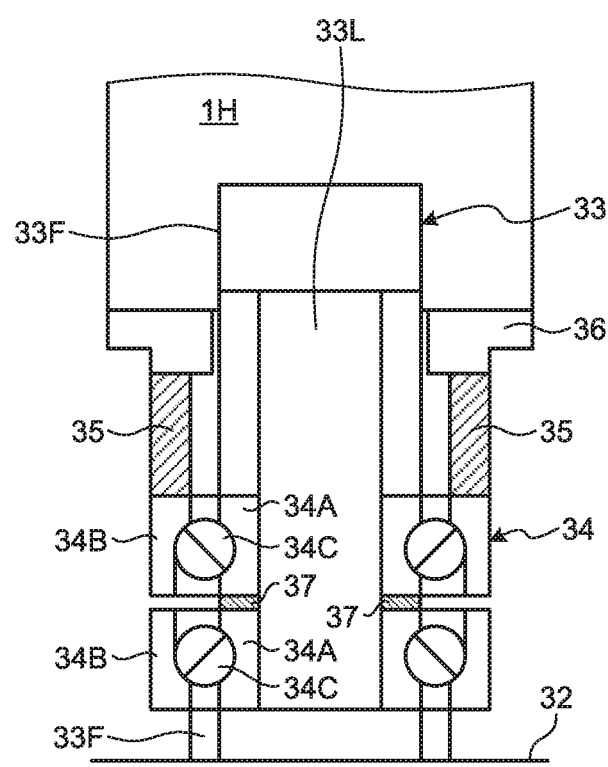
FIG. 12 is an enlarged view illustrating a region in proximity to a plane guide and a drive element according to the fifth embodiment.

FIG. 12 is an enlarged view illustrating a region in proximity to the plane guide 30B and the drive element 35 according to the present embodiment. The plane guide 30B includes the rod-like slide member 33 fixed to the support plate 32. The guide bearing 34 for movably supporting the slide member 33 in the Z axis direction is provided in the internal space 1H of the table 1. The guide bearing 34 is supported by the inner surface of the table 1 in the internal space 1H.

The guide bearing 34 includes the ball bearing. The guide bearing 34 includes: the inner ring 34A disposed to be in contact with the rod portion 33L; the outer ring 34B disposed around the inner ring 34A; and the ball 34C disposed between the inner ring 34A and the outer ring 34B. In the present embodiment, two ball bearings each including the inner ring 34A, the outer ring 34B, and the ball 34C are disposed along the Z axis direction (the direction parallel to the central axis of the rod portion 33L).

In the present embodiment, a spacer member 37 is disposed between the two inner rings 34A disposed along the vertical direction. The inner rings 34A are in contact with the spacer member 37. The two outer rings 34B disposed along the vertical direction face each other with a gap therebetween.

The drive element 35 includes a piezoelectric element, for example. The drive element 35 is disposed between the upper surface of the guide bearing 34 and a fixed member 36 fixed to the inner surface of the table 1 in the internal space 1H.

The drive element 35 can adjust the position of a lower end of the plane guide 30B (a lower end of the ball 34C in the present embodiment) in the Z axis direction. As the drive element 35 contracts, the lower end of the plane guide 30B moves upward. As the drive element 35 extends, the lower end of the plane guide 30B moves downward.

In the present embodiment, the drive element 35 is disposed between the fixed member 36 and the upper outer ring 34B of the two outer rings 34B disposed along the vertical direction of the guide bearing 34. The drive element 35 is actuated to change the distance of the two outer rings 34B. As a result, the position of the lower end of the plane guide 30B is adjusted.

According to the present embodiment, the drive element 35 can adjust the position of the lower end of the plane guide 30B in the vertical direction. As a result, the load acting on the plane guide 30B is adjusted. This prevents an excessive load from acting on the plane guide 30B, for example.

When the load acting on the table 1 in the Z axis direction is less than a predetermined value, the lower surface 1B of the table 1 and the upper surface 2A of the base member 2 face each other with the gap G therebetween. In the state where the gap G is formed, the lower end of the plane guide 30B supported by the table 1 is in contact with the upper surface 2A of the base member 2. The drive element 35 adjusts the position of the lower end of the plane guide 30B in the Z axis direction, thereby adjusting the load acting on the lower end of the plane guide 30B in contact with the upper surface 2A.

When the downward load in the vertical direction (−Z direction) that is more than or equal to the predetermined value acts on the table 1, the table 1 moves downward (in the −Z direction) while being guided by the rotary bearing 4. As the table 1 moves downward, the lower surface 1B of the table 1 comes into contact with the upper surface 2A of the base member 2. The lower surface 1B of the table 1 coming into contact with the upper surface 2A of the base member 2 allows the table 1 to be supported on the upper surface 2A of the base member 2. When the table 1 moves downward, the lower end of the plane guide 30B supported by the table 1 via the guide bearing 34 receives a load from the upper surface 2A of the base member 2. The load on the lower end of the plane guide 30B received from the upper surface 2A of the base member 2 increases when the table 1 moves downward. In the present embodiment, when the table 1 moves downward to increase the load acting on the lower end of the plane guide 30B, the drive element 35 moves the lower end of the plane guide 30B upward relative to the table 1. This prevents an increase in the load acting on the lower end of the plane guide 30B.

As described above, according to the present embodiment, providing the drive element 35 capable of moving the plane guide 30B in the Z axis direction prevents an excessive load from acting on the plane guide 30B. The load acting on the plane guide 30B can be reduced, thereby preventing an increase in the size of the plane guide 30B.

In the present embodiment, the plane guide 30B, the guide bearing 34, and the drive element 35 may be disposed in the internal space of the base member 2.

The drive element 35 of the present embodiment may be a force control actuator such as an air cylinder.

In the present embodiment, the dimension of the gap G between the table 1 and the base member 2 may be adjusted to zero by the drive element 35 when no load in the Z axis direction acts on the table 1.

Sixth Embodiment

A sixth embodiment will be described. In the following description, a component identical or equivalent to that in the aforementioned embodiment is denoted by the same reference numeral as that used in the aforementioned embodiment, and the description of such a component will be simplified or omitted.

Figure 13:
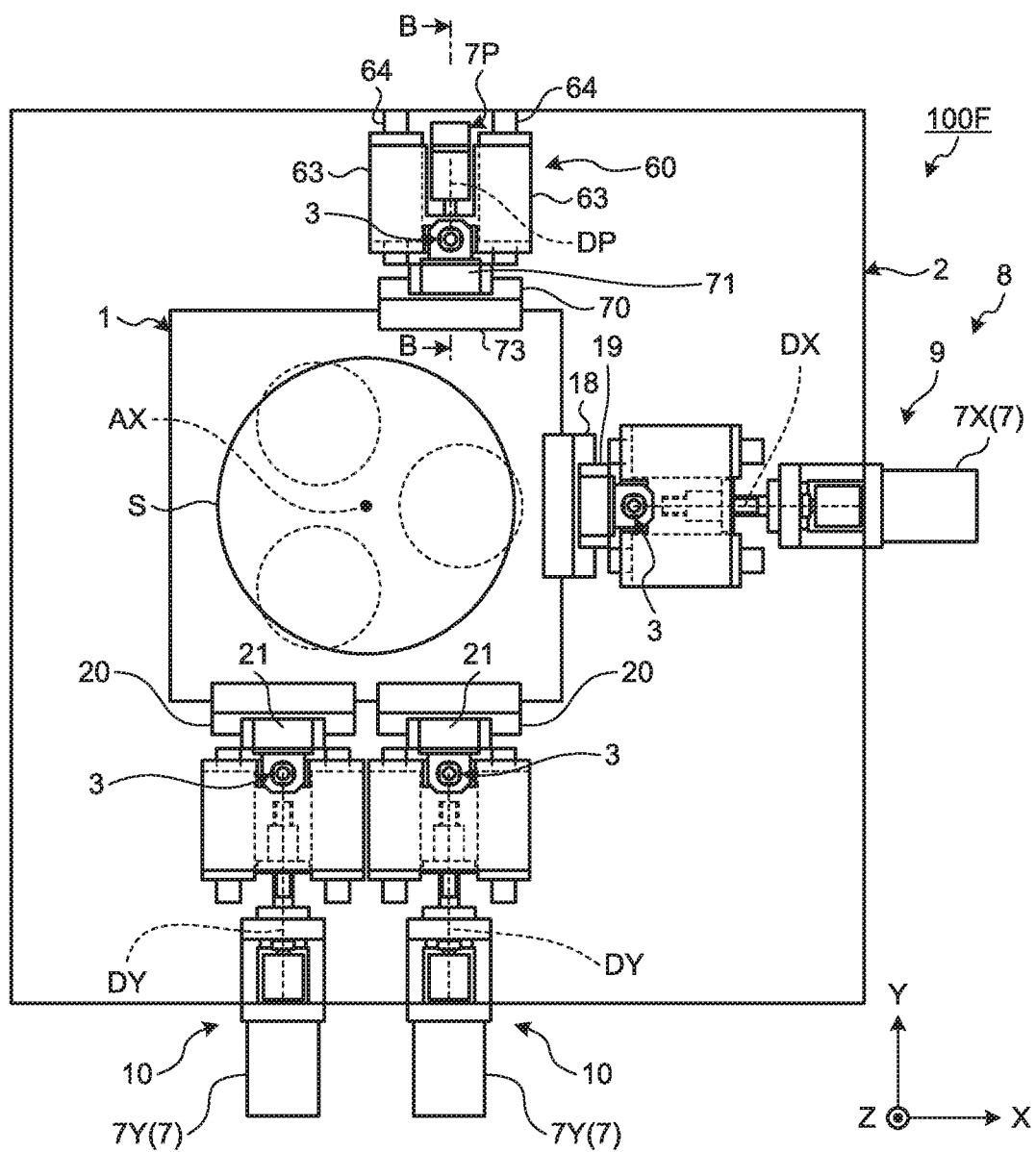
FIG. 13 is a plan view illustrating an example of a table apparatus according to a sixth embodiment.
Figure 14:
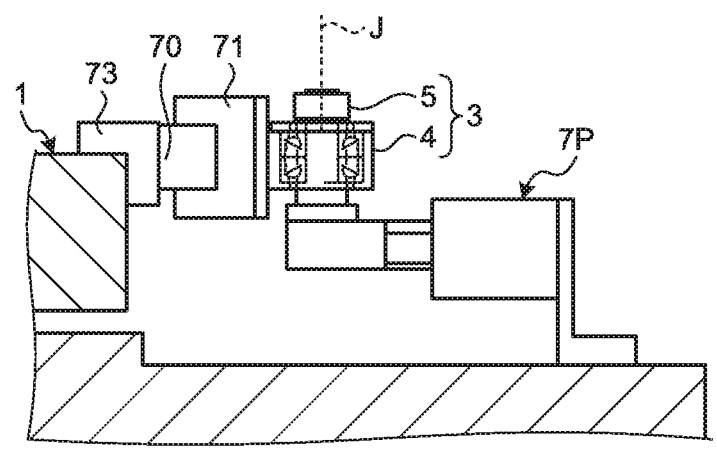
FIG. 14 is a diagram viewing from an arrow direction of a B-B line of FIG. 13.

FIG. 13 is a plan view illustrating an example of a table apparatus 100F according to the present embodiment. FIG. 14 is a diagram viewing from an arrow direction of a B-B line of FIG. 13. The table apparatus 100F according to the present embodiment is a modification of the table apparatus 100A described in the aforementioned embodiment.

Similarly to the table apparatus 100A described in the aforementioned embodiment, the table apparatus 100F includes one first driver 9 and two second drivers 10. The first driver 9 is connected to the edge of the table 1 on the +X side. The second drivers 10 are connected to the edge of the table 1 on the −Y side. The position of the central axis AX of the table is aligned with the position of the first drive axis DX of the first driver 9 in the Y axis direction. The position of the central axis AX of the table differs from the positions of the second drive axes DY of the second drivers 10 in the X axis direction.

The table apparatus 100F according to the present embodiment includes a preload device 60 that applies force in the direction of rotation (θZ direction) about the central axis AX of the table in advance to the table 1. The preload device 60 constantly applies the force in the θZ direction to the table 1 by applying force in the Y axis direction. The preload device 60 keeps applying constant force in a fixed direction about the central axis AX of the table 1 in a state where one or both of the first driver 9 and the second driver 10 generate force to move the table 1. The force (preload force) generated by the preload device 60 is smaller than the force (drive force) generated by the first driver 9 and the force (drive force) generated by the second driver 10.

The preload device 60 includes: a preload actuator 7P that is supported by the base member 2 and generates power for moving the table 1 in the Y axis direction; and a preload movable member that is coupled to the table 1 and moves along a preload drive axis DP parallel to the Y axis by the actuation of the preload actuator 7P. The preload device 60 is provided such that the position of the central axis AX of the table differs from the position of the preload drive axis DP in the X axis direction.

The preload actuator 7P of the present embodiment is an air cylinder. A cylinder portion of the preload actuator 7P is fixed to the base member 2.

The preload movable member includes: a seventh linear bearing 63 that is guided by a seventh guide member 64 provided on the base member 2 and moves along the preload drive axis DP; the rotary bearing 4 that is disposed around the rod member 5 fixed to the seventh linear bearing 63 and can rotate relative to the rod member 5 about the central axis J of the rod parallel to the Z axis; and an eighth linear bearing 71 that is connected to the rotary bearing 4 and is guided in the X axis direction by an eighth guide member 70 fixed to the edge of the table 1 on the +Y side.

The seventh linear bearing 63 is connected to a rod portion of the preload actuator 7P and moves along the preload drive axis DP by the actuation of the preload actuator 7P. The seventh guide member 64 is fixed to the base member 2 and guides the seventh linear bearing 63 in the Y axis direction. The eighth guide member 70 is fixed to the edge of the table 1 on the +Y side via a connecting member 73. The eighth linear bearing 71 is guided in the X axis direction by the eighth guide member 70.

The rod portion of the preload actuator 7P or the seventh linear bearing 63 and the eighth linear bearing 71 are coupled to each other by the coupler 3 including the rotary bearing 4 and the rod member 5. The coupler 3 is similar to the coupler 3 described in the aforementioned embodiment and thus will not be described.

As described above, according to the present embodiment, the preload device 60 causes a moment in the direction of rotation to constantly act on the table 1. This eliminates play in the mechanism of the table apparatus 100F, thereby preventing the insufficient positioning accuracy of the table apparatus 100F.

Moreover, according to the present embodiment, the position of the central axis AX of the table differs from the position of the preload drive axis DP of the preload device 60 in the X axis direction. As a result, the force generated by the preload actuator 7P can cause the moment to smoothly act on the table 1.

According to the present embodiment, the preload actuator 7P and the eighth linear bearing 71 are coupled to each other by the coupler 3 including the rod member 5 and the rotary bearing 4. Therefore, even when the table 1 rotates about the central axis AX of the table, the relative rotation between the rod member 5 and the rotary bearing 4 prevents a moment from acting on the eighth linear bearing 71 and the eighth guide member 70. This prevents the accuracy in positioning the table apparatus 100F from deteriorating.

Moreover, according to the present embodiment, the relative movement is allowed between the eighth linear bearing 71 and the eighth guide member 70 and between the seventh linear bearing 63 and the seventh guide member 64, and the cylinder applies the constant force while the position thereof is not fixed, which allows the table 1 to rotate smoothly.

In the present embodiment, the preload actuator 7P is assumed to be the air cylinder. The preload actuator 7P may instead be a servomotor that applies a preload to the table 1 via a ball screw mechanism. However, the motor is controlled not in a positioning mode but in a torque mode. This also applies to the following embodiments.

Seventh Embodiment

A seventh embodiment will be described. In the following description, a component identical or equivalent to that in the aforementioned embodiment is denoted by the same reference numeral as that used in the aforementioned embodiment, and the description of such a component will be simplified or omitted.

Figure 15:
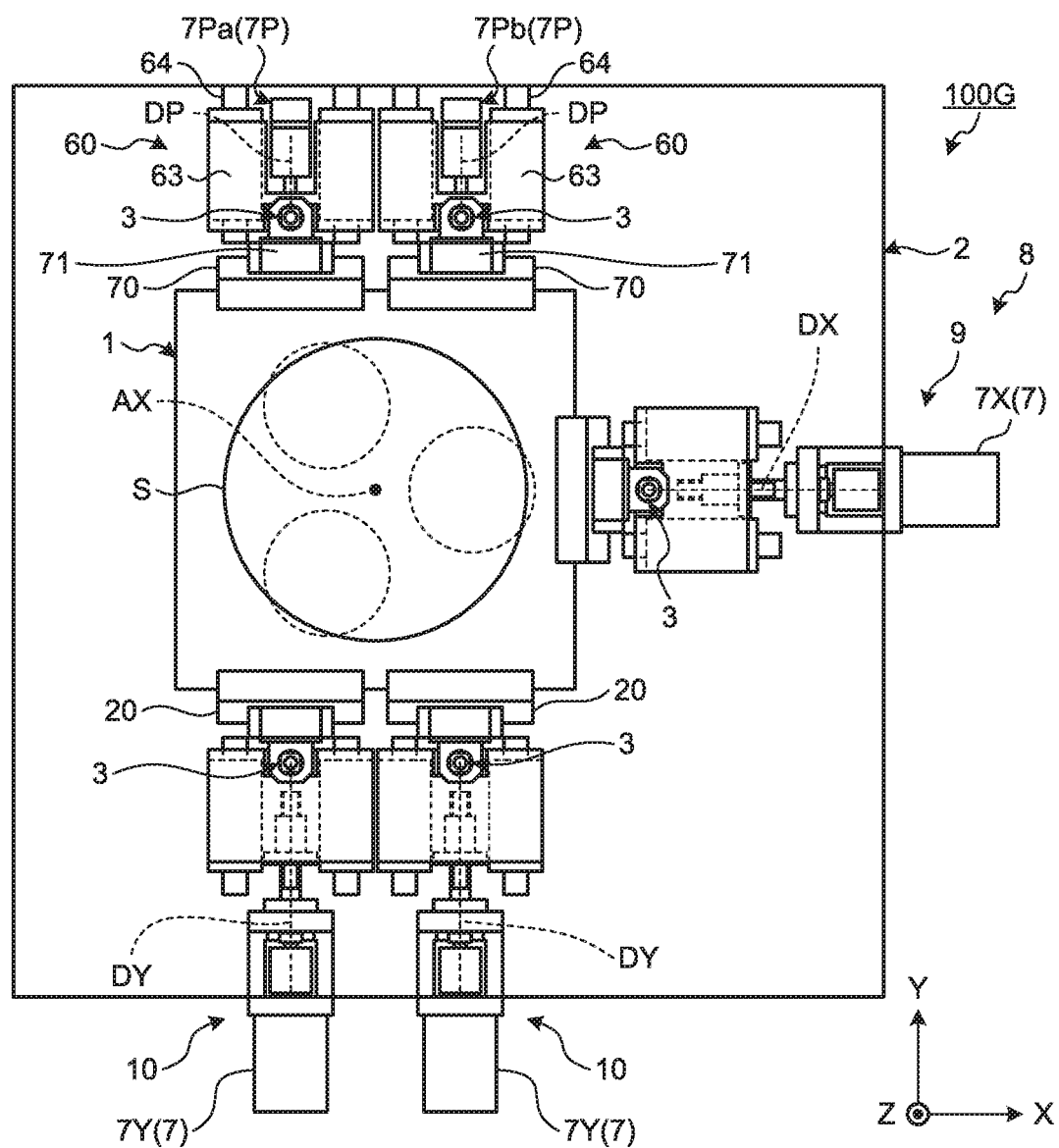
FIG. 15 is a plan view illustrating an example of a table apparatus according to a seventh embodiment.

FIG. 15 is a plan view illustrating an example of a table apparatus 100G according to the present embodiment. The table apparatus 100G according to the present embodiment is a modification of the table apparatus 100F described in the aforementioned embodiment.

The table apparatus 100G is provided with two preload devices 60 such that the position of the central axis AX of the table differs from the positions of the preload drive axes DP in the X axis direction. In the present embodiment, the force applied by each of the two preload devices 60 to the table 1 is different. That is, the output from a preload actuator 7Pa of one of the preload devices 60 is different in magnitude from the output from a preload actuator 7Pb of the other of the preload devices 60.

As described above, the present embodiment is provided with the two preload devices 60 to be able to apply different force to two positions at the edge of the table 1 on the +Y side and apply a moment to the table 1 in the θZ direction, thereby preventing the insufficient accuracy in positioning the table 1 in the θZ direction. Moreover, according to the present embodiment, the two preload devices 60 are disposed to be symmetrical with the two second drivers 10, so that frictional force acting on the third guide member 14 of the second driver 10 is symmetrical about the X axis with frictional force acting on the seventh guide member 64 of the preload device 60, which prevents an error in positioning the table 1 in the θZ direction. Moreover, according to the present embodiment, the two second drivers 10 and the two preload devices 60 are disposed such that frictional force acting on the fourth guide member 20 is symmetrical with frictional force acting on the eighth guide member 70 when the table 1 moves in the X axis direction by the actuation of the first driver 9, thereby preventing a positioning error (rotational error) of the table 1 in the θZ direction.

Eighth Embodiment

An eighth embodiment will be described. In the following description, a component identical or equivalent to that in the aforementioned embodiment is denoted by the same reference numeral as that used in the aforementioned embodiment, and the description of such a component will be simplified or omitted.

Figure 16:
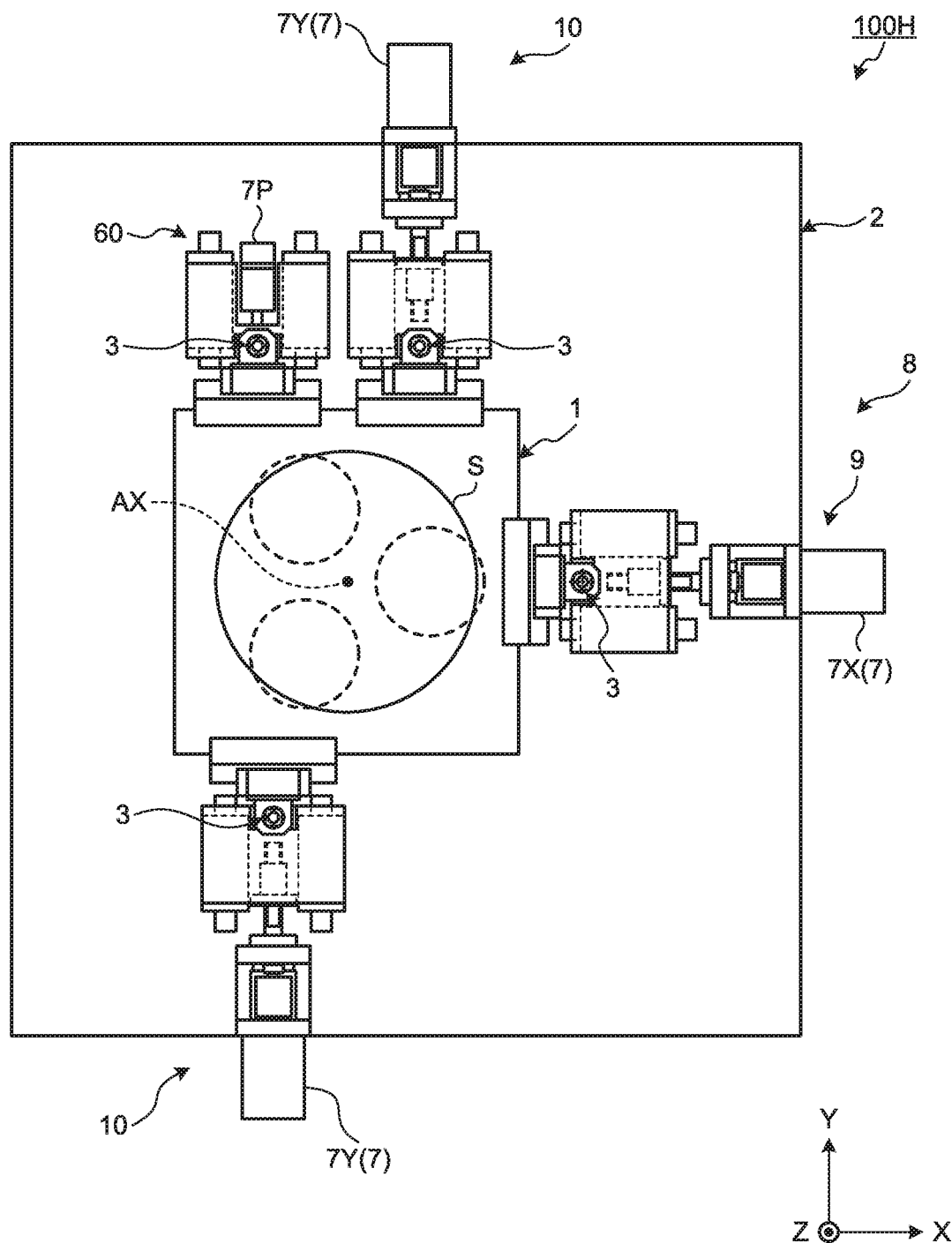
FIG. 16 is a plan view illustrating an example of a table apparatus according to an eighth embodiment.

FIG. 16 is a plan view illustrating an example of a table apparatus 100H according to the present embodiment. The table apparatus 100H according to the present embodiment is an embodiment in which the preload device 60 is provided in the table apparatus 100C described with reference to FIG. 8. As illustrated in FIG. 16, one of the two second drivers 10 is connected to the edge of the table 1 on the +Y side, and the other of the second drivers 10 is connected to the edge of the table 1 on the −Y side.

The present embodiment also prevents the insufficient positioning accuracy of the table apparatus 100H.

Ninth Embodiment

A ninth embodiment will be described. In the following description, a component identical or equivalent to that in the aforementioned embodiment is denoted by the same reference numeral as that used in the aforementioned embodiment, and the description of such a component will be simplified or omitted.

Figure 17:
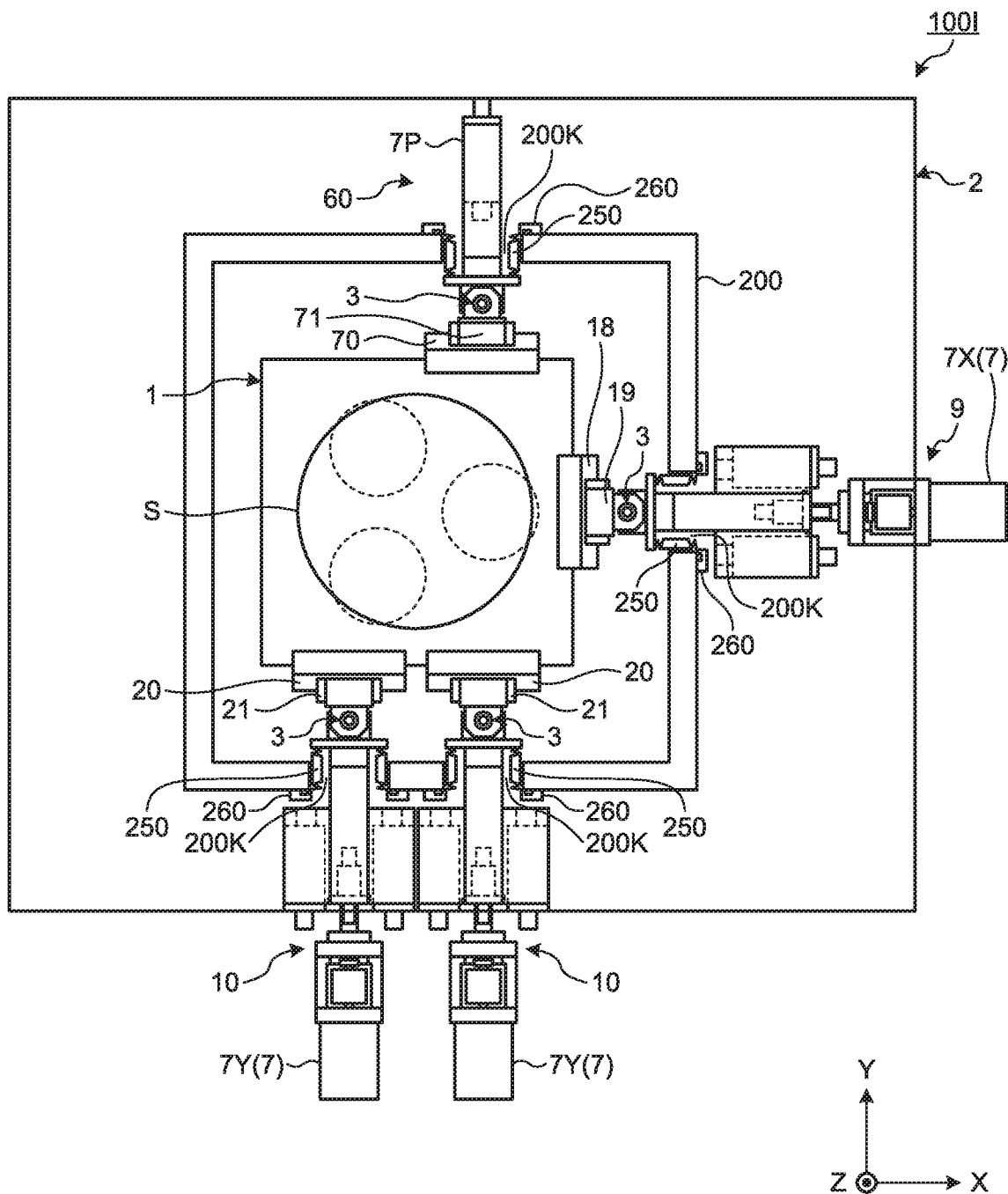
FIG. 17 is a plan view illustrating an example of a table apparatus according to a ninth embodiment.
Figure 18:
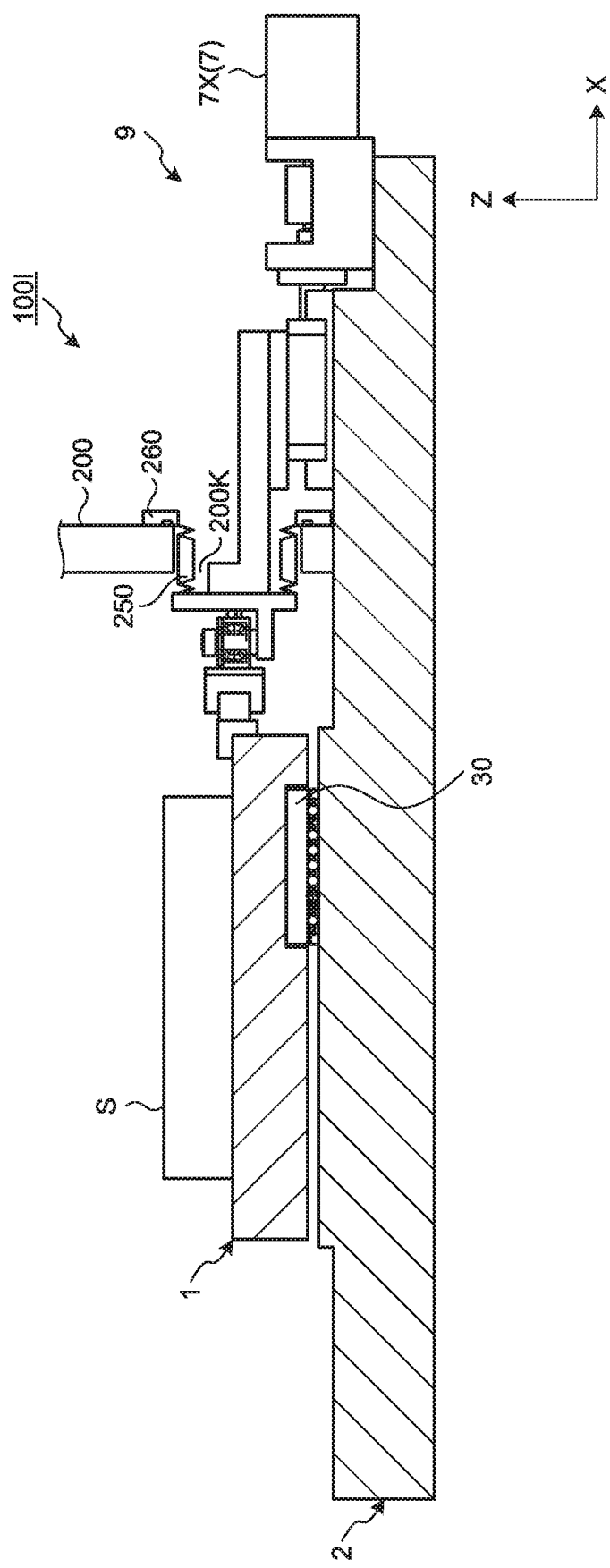
FIG. 18 is a side cross-sectional view illustrating an example of the table apparatus according to the ninth embodiment.

FIG. 17 is a plan view illustrating an example of a table apparatus 100I according to the present embodiment. FIG. 18 is a side cross-sectional view illustrating an example of the table apparatus 100I according to the present embodiment. Similarly to the aforementioned embodiment, the table apparatus 100I includes the first driver 9, the second drivers 10, and the preload device 60.

In the present embodiment, at least a part of the table apparatus 100I is disposed in an internal space of a chamber device 200. In the present embodiment, the table 1, the guide members 18, 20, and 70, the linear bearings 19, 21, and 71, the coupler 3, and the like are disposed in the internal space of the chamber device 200.

The first actuator 7X, the second actuators 7Y, and the preload actuator 7P are disposed in an external space of the chamber device 200.

The chamber device 200 includes an environmental control system that controls the environment of the internal space. The environment of the internal space includes a type of gas in the internal space with which the pressure changes inside and outside the chamber device 200. The environment of the internal space may be a temperature in the internal space with which the pressure changes inside and outside the chamber device 200. The environment of the internal space may be humidity in the internal space with which the pressure changes inside and outside the chamber device 200. The environment of the internal space may be pressure (including a degree of vacuum) in the internal space with which the pressure changes inside and outside the chamber device 200. The environment of the internal space may be cleanliness in the internal space with which the pressure changes inside and outside the chamber device 200.

The environmental control system controls the internal space of the chamber device 200 to be in a vacuum state, for example. The environmental control system further controls the internal space of the chamber device 200 to have a constant temperature.

The chamber device 200 has a plurality of openings 200K that connects the internal space and the external space. The first driver 9, the second drivers 10, and the preload device 60 are disposed in the respective openings 200K.

The chamber device 200 includes a bellows 250 disposed in the opening 200K and a support device 260 that supports the bellows 250. The bellows 250 prevents the generation of force by a difference in pressure between the internal space and the external space of the chamber device 200. The bellows 250 prevents gas flow between the internal space and the external space.

As described above, the present embodiment is provided with the chamber device 200 having the internal space in which at least the table 1 is disposed, whereby a workpiece S supported on the table 1 is processed in the internal space of the chamber device 200 whose environment is controlled. The actuators 7X, 7Y, and 7P are disposed in the external space of the chamber device 200, which prevents heat generated from the actuators 7X, 7Y, and 7P, for example, from affecting the table 1 and the workpiece S. This also prevents a foreign matter generated from the actuators 7X, 7Y, and 7P, from affecting the table 1 and the workpiece S. The chamber device 200 does not accommodate the entire table apparatus 100I in the internal space. The chamber device 200 accommodate the table 1, the guide members 18, 20, and 70, the linear bearings 19, 21, and 71, the coupler 3, and the like in the internal space, and the actuators 7X, 7Y, and 7P are disposed in the external space of the chamber device 200, which prevents an increase in size of the chamber device 200.

Tenth Embodiment

A tenth embodiment will be described. In the following description, a component identical or equivalent to that in the aforementioned embodiment is denoted by the same reference numeral as that used in the aforementioned embodiment, and the description of such a component will be simplified or omitted.

Figure 19:
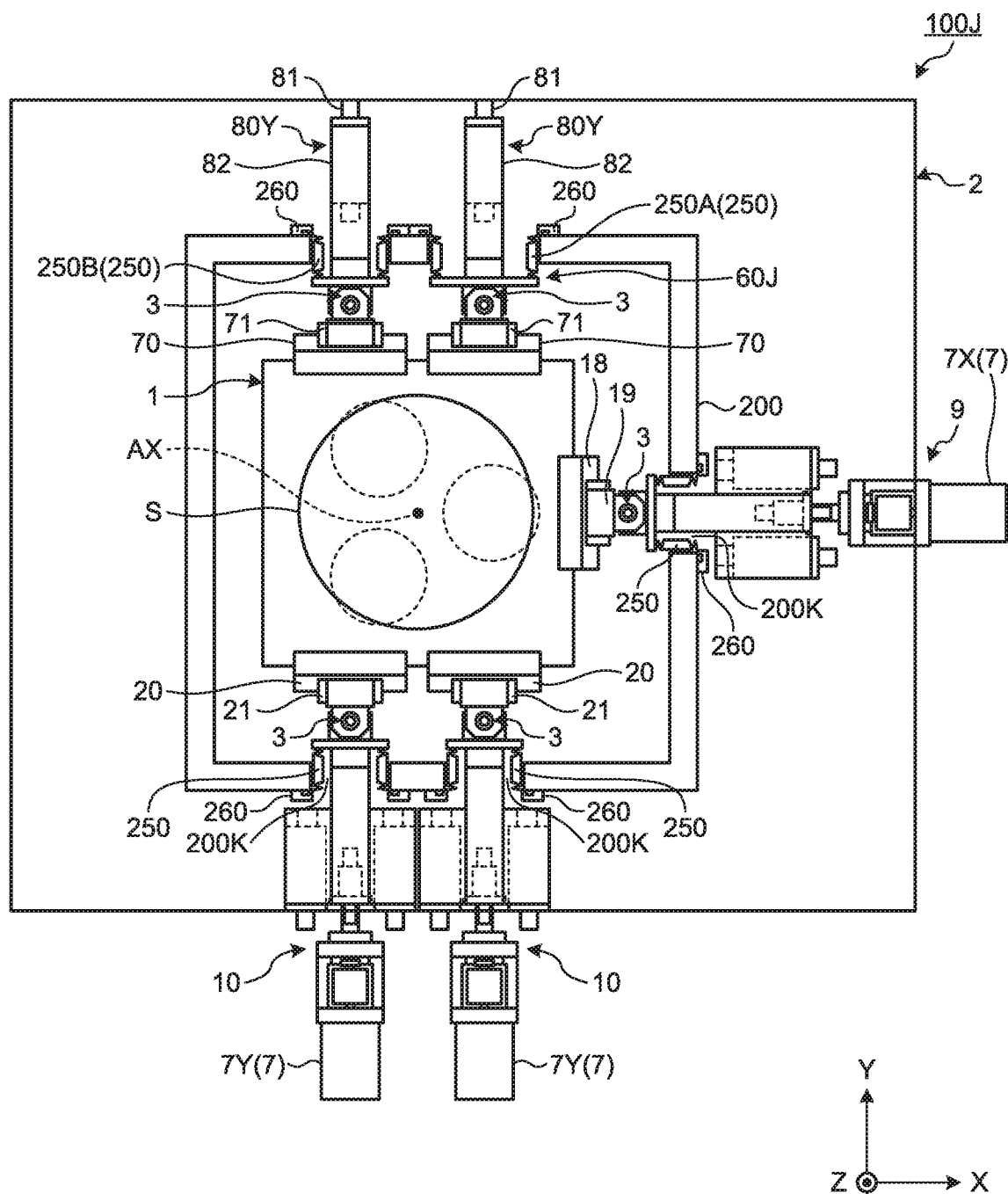
FIG. 19 is a plan view illustrating an example of a table apparatus according to a tenth embodiment.

FIG. 19 is a plan view illustrating an example of a table apparatus 100J according to the present embodiment. The table apparatus 100J includes a guide 80Y that is coupled to the edge of the table 1 on the +Y side and guides the table 1 in the Y axis direction. Two guides 80Y are disposed along the X axis direction. The guide 80Y does not include a power source like an actuator.

The guide 80Y includes a ninth linear bearing 82 that is guided in the Y axis direction by a ninth guide member 81 provided on the base member 2. The ninth linear bearing 82 is coupled to the eighth linear bearing 71 via the coupler 3. The eighth linear bearing 71 is guided by the eighth guide member 70 provided on the table 1. The ninth guide member 81 is fixed to the base member 2 so as to extend in the Y axis direction. The ninth linear bearing 82 is movable in the Y axis direction while being guided by the ninth guide member 81.

A preload device 60J of the present embodiment does not have a preload actuator. The elastic force of the bellows 250 applies force to the table 1 in the direction of rotation about the central axis AX of the table.

The bellows 250 includes a first bellows 250A for applying first elastic force to the table 1 and a second bellows 250B for applying second elastic force to the table 1. The position of the central axis AX of the table differs from each of the position of the first bellows 250A and the position of the second bellows 250B in the X axis direction. The force applied to the table 1 by the first bellows 250A is different from the force applied to the table 1 by the second bellows 250B. By making the area of the bellows 250A different from the area of the second bellows 250B, for example, the force applied to the table 1 by the first bellows 250A can be made different from the force applied to the table 1 by the second bellows 250B. The bellows 250 is a cylindrical member disposed in the opening 200K, and the area of the bellows 250 corresponds to the area of the opening of the bellows 250 being the cylindrical member.

The first bellows 250A is provided to couple one of the two guides 80Y and the chamber device 200. The second bellows 250B is provided to couple the other of the two guides 80Y and the chamber device 200.

As described above, the force applied to the table 1 by the preload device 60J is not limited to the power generated by the preload actuator but may be the elastic force generated by the bellows 250.

Eleventh Embodiment

An eleventh embodiment will be described. In the following description, a component identical or equivalent to that in the aforementioned embodiment is denoted by the same reference numeral as that used in the aforementioned embodiment, and the description of such a component will be simplified or omitted.

Figure 20:
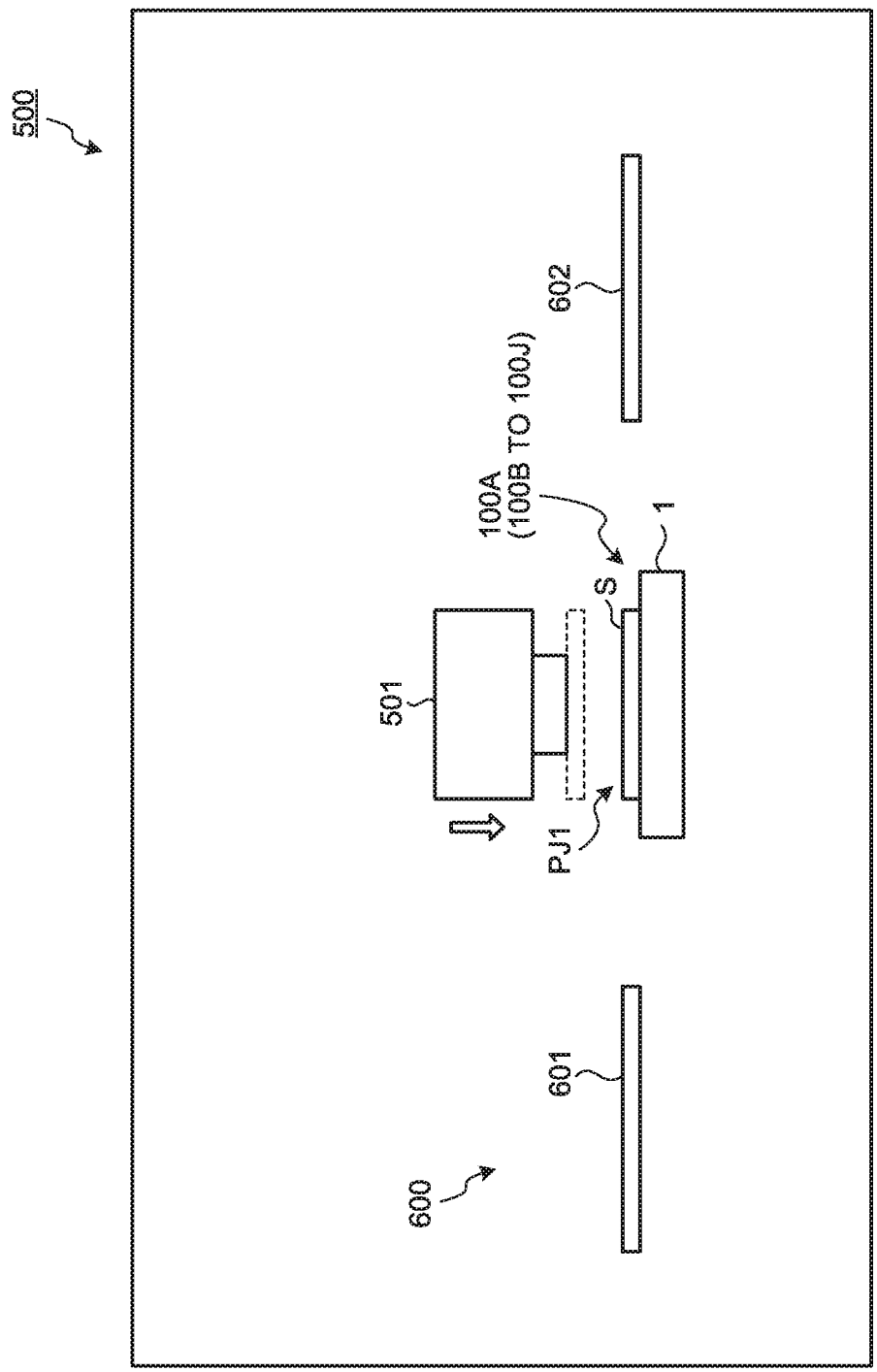
FIG. 20 is a diagram illustrating an example of a flat panel display manufacturing apparatus according to an eleventh embodiment.

FIG. 20 is a diagram illustrating an example of a flat panel display manufacturing apparatus 500 that includes the table apparatus 100A (or any one of 100B to 100J) according to the present embodiment. The flat panel display manufacturing apparatus 500 is used in at least a part of manufacturing processes of a flat panel display. The flat panel display includes at least one of a liquid crystal display, a plasma display, and an organic EL display.

The flat panel display manufacturing apparatus 500 includes a conveyor 600 capable of conveying a workpiece S from which the flat panel display is manufactured. The conveyor 600 includes the table apparatus 100A according to the present embodiment.

FIG. 20 schematically illustrates the table apparatus 100A. The workpiece S is supported on the table 1.

In the present embodiment, the workpiece S is a substrate used to manufacture the flat panel display. The flat panel display is manufactured from the workpiece S. The workpiece S may include a glass plate. When a liquid crystal display is manufactured, the workpiece S may include a TFT substrate or a color filter substrate.

The flat panel display manufacturing apparatus 500 performs the manufacturing processes of the flat panel display using the workpiece S disposed at a processing position (target position) PJ1. The table apparatus 100A disposes the workpiece S supported on the table 1 at the processing position PJ1. The conveyor 600 includes a carry-in device 601 capable of conveying (carrying in) the workpiece S onto the table 1 of the table apparatus 100A, and a carry-out device 602 capable of conveying (carrying out) the workpiece S from the table 1. The carry-in device 601 conveys (carries in) the workpiece S yet to be processed to the table 1. The table apparatus 100A conveys the workpiece S supported on the table 1 to the processing position PJ1. The carry-out device 602 conveys (carries out) the workpiece S that has been processed from the table 1.

The table apparatus 100A moves the table 1 to move the workpiece S supported on the table 1 to the processing position PJ1. The table apparatus 100A can dispose the workpiece S supported on the table 1 at the processing position PJ1 with high positioning accuracy.

When the flat panel display manufacturing apparatus 500 includes a bonding device for bonding two substrates together, for example, the workpiece S supported on the table 1 includes one of the two substrates. The processing position PJ1 includes a bonding position at which the one substrate is bonded to the other substrate. The other substrate is pressed against the one substrate on the table 1 disposed at the bonding position.

In the present embodiment, the flat panel display manufacturing apparatus 500 has a substrate holder 501 for holding the other substrate. The substrate holder 501 functions as a processing unit that processes the workpiece S (the one substrate) supported on the table 1. The substrate holder 501 causes the one substrate disposed at the bonding position and the other substrate held by the substrate holder 501 to face each other. The substrate holder 501 moves downward so as to press the other substrate against the one substrate supported on the table 1. As a result, the two substrates are bonded together.

After the workpiece S is processed at the processing position PJ1, the carry-out device 602 conveys the processed workpiece S from the table 1. The workpiece S conveyed (carried out) by the carry-out device 602 is conveyed to a processor that performs subsequent processes.

In the present embodiment, the table apparatus 100A can dispose the workpiece S at the processing position PJ1. The present embodiment also prevents the insufficient accuracy in positioning the table 1. This prevents a defective product (flat panel display) from being manufactured.

The table apparatus 100A (or any one of 100B to 100J) may be used in a semiconductor manufacturing apparatus. The semiconductor manufacturing apparatus includes, for example, an exposure device that forms a device pattern on a workpiece S by a projection optical system. The processing position PJ1 of the exposure device includes an image surface position (exposure position) of the projection optical system. The projection optical system functions as a processing unit that performs exposure processing on the workpiece S supported on the table 1. With the workpiece S disposed at the processing position PJ1, the semiconductor manufacturing apparatus can form a device pattern on the workpiece S by the projection optical system.

The semiconductor manufacturing apparatus may include a film forming device that forms a film on a workpiece S. In the case where the semiconductor manufacturing apparatus includes the film forming device, the processing position PJ1 includes a feed position (film forming position) to which a material used to form a film is fed. A feed unit for feeding the material functions as a processing unit that performs film formation on the workpiece S supported on the table 1. With the workpiece S disposed at the processing position PJ1, the film for forming the device pattern is formed on the workpiece S.

Twelfth Embodiment

Figure 21:
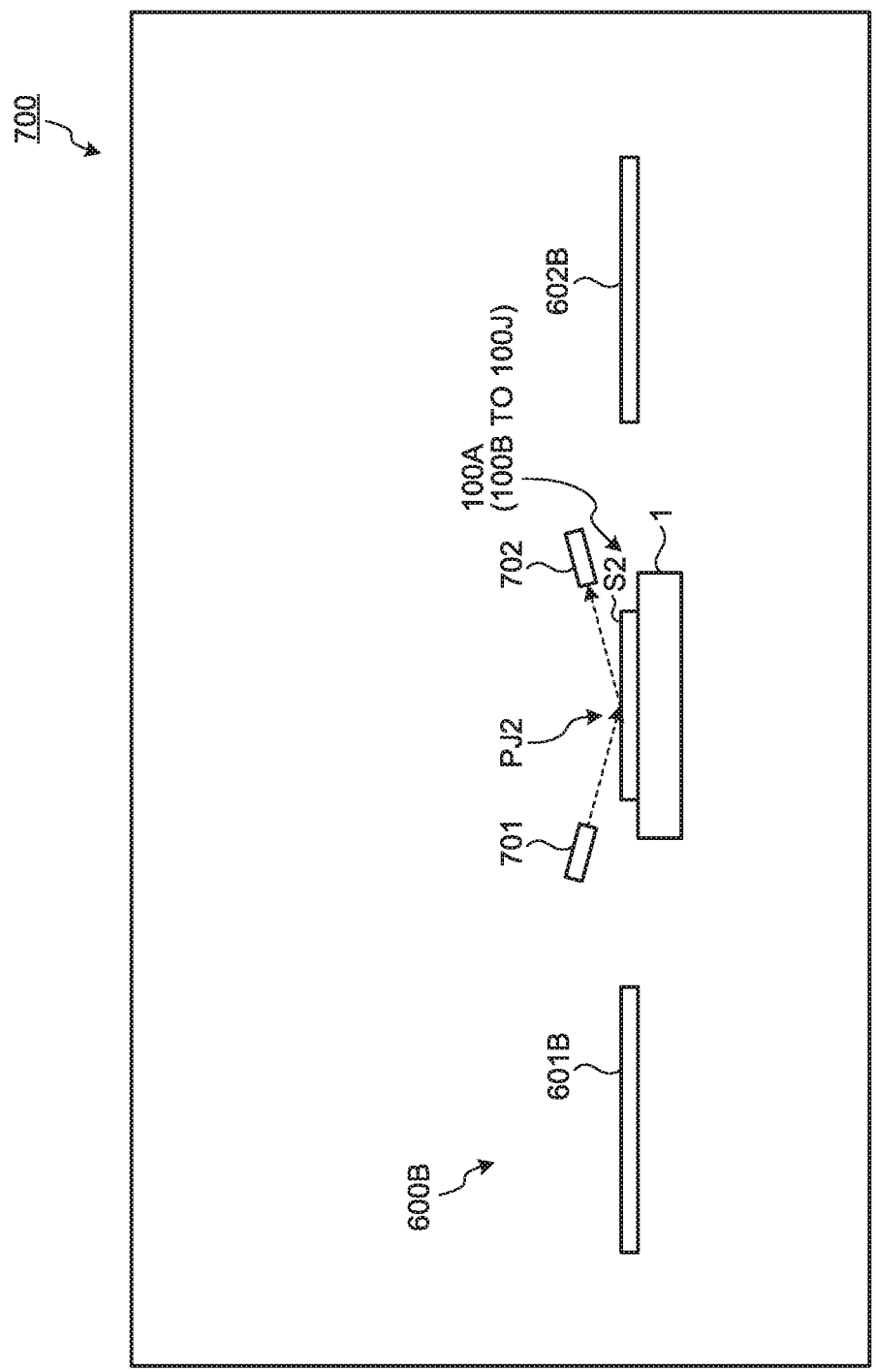
FIG. 21 is a diagram illustrating an example of a precision machine according to a twelfth embodiment.

A twelfth embodiment will be described. FIG. 21 is a diagram illustrating an example of a precision machine 700 that includes the table apparatus 100A (or any one of 100B to 100J) according to the present embodiment. The present embodiment describes an example in which the precision machine 700 is a precision measuring instrument such as a precision instrument that precisely measures a workpiece.

The precision measuring instrument 700 measures a workpiece S2. The workpiece S2 may include at least one of a flat panel display manufactured by the flat panel display manufacturing apparatus 500 and a semiconductor device manufactured by the semiconductor manufacturing apparatus described above. The precision measuring instrument 700 includes a conveyor 600B that can convey the workpiece S2. The conveyor 600B includes the table apparatus 100A according to the present embodiment.

FIG. 21 schematically illustrates the table apparatus 100A. The workpiece S2 is supported on the table 1.

The precision measuring instrument 700 measures the workpiece S2 disposed at a measurement position (target position) PJ2. The table apparatus 100A disposes the workpiece S2 supported on the table 1 at the measurement position PJ2. The conveyor 600B includes a carry-in device 601B capable of conveying (carrying in) the workpiece S2 onto the table 1 of the table apparatus 100A and a carry-out device 602B capable of conveying (carrying out) the workpiece S2 from the table 1. The carry-in device 601B conveys (carries in) the workpiece S2 yet to be measured to the table 1. The table apparatus 100A conveys the workpiece S2 supported on the table 1 to the measurement position PJ2. The carry-out device 602B conveys (carries out) the workpiece S2 that has been measured from the table 1.

The table apparatus 100A moves the table 1 to move the workpiece S2 supported on the table 1 to the measurement position PJ2. The table apparatus 100A can dispose the workpiece S2 supported on the table 1 at the measurement position PJ2 with high positioning accuracy.

The precision measuring instrument 700 of the present embodiment optically measures the workpiece S2 using detection light. The precision measuring instrument 700 includes a irradiation device 701 capable of emitting the detection light and a light receiving device 702 capable of receiving at least a part of the detection light emitted from the irradiation device 701 and reflected by the workpiece S2. In the present embodiment, the measurement position PJ2 includes an irradiation position of the detection light. The irradiation device 701 and the light receiving device 702 each function as a processing unit that processes the workpiece S2 supported on the table 1. In the present embodiment, the irradiation device 701 and the light receiving device 702 each function as a measuring unit that measures the workpiece S2 supported on the table 1. With the workpiece S2 disposed at the measurement position PJ2, the state of the workpiece S2 is optically measured.

After the workpiece S2 is measured at the measurement position PJ2, the carry-out device 602B conveys the workpiece S2 that has been measured from the table 1.

The table apparatus 100A of the present embodiment can dispose the workpiece S2 at the measurement position (target position) PJ2, and thus can prevent the occurrence of a measurement failure. That is, the precision measuring instrument 700 can excellently determine whether the workpiece S2 is defective. This prevents the workpiece S2 that is found defective from being conveyed to subsequent processes or being shipped, for example. Moreover, the precision measuring instrument 700 can measure the workpiece S2 disposed at the measurement position PJ2 by the table 1, and thus can measure the workpiece S2 with precision.

A three-dimensional measuring apparatus may include the table apparatus 100A according to the present embodiment, or may include a conveyor including the table apparatus 100A. With a workpiece to be measured being supported on the table 1, the three-dimensional measuring apparatus can measure the workpiece disposed at a target position, and thus can measure the workpiece with precision.

Thirteenth Embodiment

Figure 22:
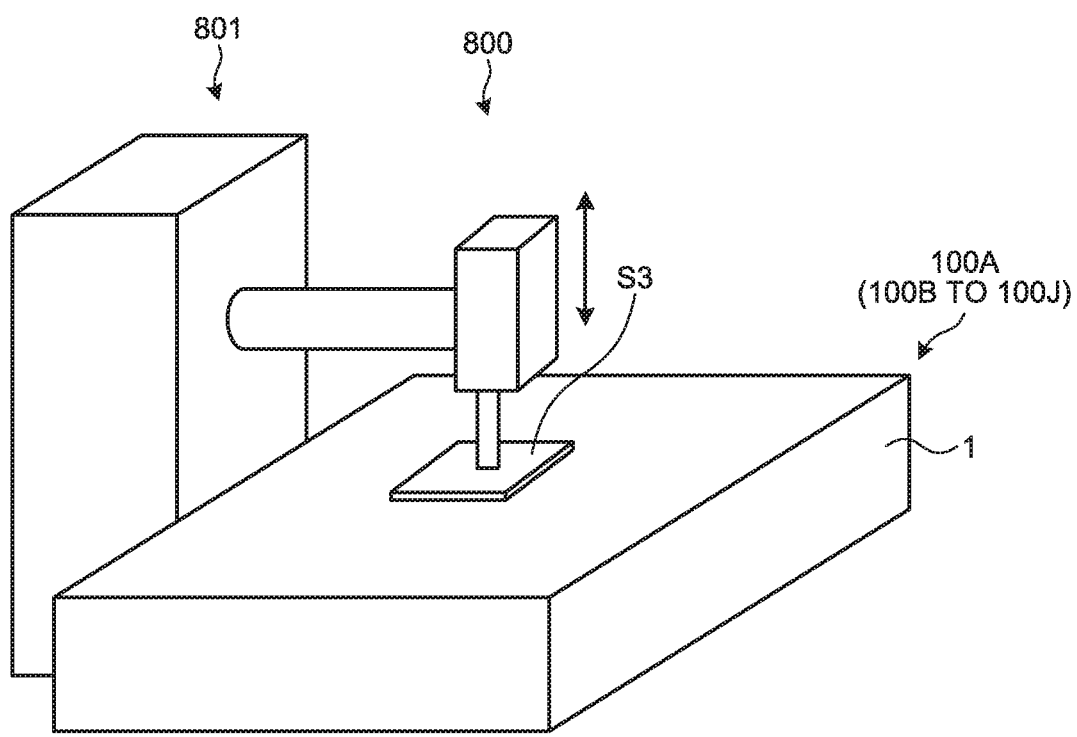
FIG. 22 is a diagram illustrating an example of a precision machine according to a thirteenth embodiment.

A thirteenth embodiment will be described. FIG. 22 is a diagram illustrating an example of a precision machine 800 that includes the table apparatus 100A (or any one of 100B to 100J) according to the present embodiment. The present embodiment describes an example in which the precision machine 800 is a precision processing machine capable of performing precision machining.

The precision processing machine 800 machines a workpiece S3. The precision processing machine 800 includes a machining center, and has the table apparatus 100A and a machining head 801. The machining head 801 functions as a processing unit that processes the workpiece S3 supported on the table 1 of the table apparatus 100A. In the present embodiment, the machining head 801 functions as a machining unit that machines the workpiece S3 supported on the table 1 of the table apparatus 100A. The machining head 801 has a machining tool, which is used to machine the workpiece S3 supported on the table 1 of the table apparatus 100A. The machining head 801 is a mechanism for cutting the workpiece S3. The machining head 801 moves the machining tool in the Z axis direction orthogonal to the movement direction of the table 1.

The precision processing machine 800 can move the machining tool and the workpiece S3 relative to each other by moving the workpiece S3 in the XY plane with the table apparatus 100A and moving the machining head 801 in the Z axis direction.

The precision processing machine 800 can machine the workpiece S3 on the table 1 disposed at a machining position (target position), and thus can machine the workpiece S3 with precision.

In the present embodiment, the table 1 is assumed to move in the XY plane (in a horizontal plane). In the present embodiment, the table 1 may instead move in a direction inclined with respect to the XY plane. That is, the XY plane may be parallel to the horizontal plane or inclined with respect to the horizontal plane.

REFERENCE SIGNS LIST

1 TABLE
1A UPPER SURFACE
1B LOWER SURFACE
1H INTERNAL SPACE
2 BASE MEMBER
2A UPPER SURFACE (GUIDE SURFACE)
3 COUPLER
4 ROTARY BEARING
4A INNER RING
4B OUTER RING
4C BALL
5 ROD MEMBER
5F FLANGE PORTION
5L ROD PORTION

6X FIRST SUPPORT MEMBER
6Y SECOND SUPPORT MEMBER
7 ACTUATOR
7X FIRST ACTUATOR
7Y SECOND ACTUATOR
7P PRELOAD ACTUATOR
8 MOVING SYSTEM
9 FIRST DRIVER
10 SECOND DRIVER
11 FIRST LINEAR BEARING
12 FIRST GUIDE MEMBER
13 THIRD LINEAR BEARING
14 THIRD GUIDE MEMBER
13B FIFTH LINEAR BEARING
14B FIFTH GUIDE MEMBER
15 BALL SCREW MECHANISM
15X FIRST BALL SCREW MECHANISM
15Y SECOND BALL SCREW MECHANISM
16 COUPLING
17 CASING
18 SECOND GUIDE MEMBER
19 SECOND LINEAR BEARING
20 FOURTH GUIDE MEMBER
21 FOURTH LINEAR BEARING
20B SIXTH GUIDE MEMBER
21B SIXTH LINEAR BEARING
22 CONNECTING MEMBER
23 CONNECTING MEMBER
30 PLANE GUIDE
30B PLANE GUIDE
31 BALL
32 SUPPORT PLATE
33 SLIDE MEMBER
33F FLANGE PORTION
33L ROD PORTION
34 GUIDE BEARING
35 DRIVE ELEMENT
36 FIXED MEMBER
37 SPACER MEMBER
50 AUXILIARY GUIDE
60 PRELOAD DEVICE
63 SEVENTH LINEAR BEARING
64 SEVENTH GUIDE MEMBER
70 EIGHTH GUIDE MEMBER
71 EIGHTH LINEAR BEARING
73 CONNECTING MEMBER
80Y GUIDE
81 NINTH GUIDE MEMBER
82 NINTH LINEAR BEARING
100A TABLE APPARATUS
100B TABLE APPARATUS
100C TABLE APPARATUS
100D TABLE APPARATUS
100E TABLE APPARATUS
100F TABLE APPARATUS
100G TABLE APPARATUS
100H TABLE APPARATUS
100I TABLE APPARATUS
100J TABLE APPARATUS
200 CHAMBER DEVICE
200K OPENING
250 BELLOWS
260 SUPPORT DEVICE
500 FLAT PANEL DISPLAY MANUFACTURING APPARATUS
700 PRECISION MACHINE (PRECISION MEASURING INSTRUMENT)
800 PRECISION MACHINE (PRECISION PROCESSING MACHINE)
AX CENTRAL AXIS OF TABLE
DP PRELOAD DRIVE AXIS
DX FIRST DRIVE AXIS
DY SECOND DRIVE AXIS
G GAP
S WORKPIECE

The invention claimed is:

1. A table apparatus comprising:
a base member having a guide surface;
a table that is supported on the base member, is movable in a first axis direction parallel to a first axis in a predetermined plane parallel to the guide surface and in a second axis direction parallel to a second axis orthogonal to the first axis in the predetermined plane, and is rotatable about a central axis of the table parallel to a third axis orthogonal to the predetermined plane;
a first driver that applies force in the first axis direction to the table; and
a second driver that applies force in the second axis direction to the table, wherein
the first driver includes: a first actuator that is supported by the base member and generates power for moving the table in the first axis direction; and a first movable member that is coupled to the table and moves along a first drive axis parallel to the first axis by actuation of the first actuator,
the second driver includes: a second actuator that is supported by the base member and generates power for moving the table in the second axis direction; and a second movable member that is coupled to the table and moves along a second drive axis parallel to the second axis by actuation of the second actuator,
the first driver is only one first driver, and the only one first driver is provided such that, in the second axis direction, a position of the central axis of the table is aligned with a position of the first drive axis,
the second driver comprises at least two second drivers, and the at least two second drivers are provided such that, in the first axis direction, a position of the central axis of the table differs from a position of each second drive axis, and
the first movable member includes: a first linear bearing that is guided by a first guide member provided on the base member and moves along the first drive axis; a first rotary bearing that is disposed around a first rod member fixed to the first linear bearing and is rotatable relative to the first rod member about a central axis of the first rod parallel to the third axis; and a second linear bearing that is connected to the first rotary bearing and is guided in the second axis direction by a second guide member fixed to an edge of the table in the first axial direction.

2. The table apparatus according to claim 1, wherein the second movable member includes: a third linear bearing that is guided by a third guide member provided on the base member and moves along the second drive axis; a second rotary bearing that is disposed around a second rod member fixed to the third linear bearing and is rotatable relative to the second rod member about a central axis of the second rod parallel to the third axis; and a fourth linear bearing that is connected to the second rotary bearing and is guided in the first axis direction by a fourth guide member fixed to an edge of the table in the second axis direction.

3. The table apparatus according to claim 1, wherein
the second driver is connected to one edge of the table in the second axis direction, and
the table apparatus further includes:
- a fifth linear bearing that is guided by a fifth guide member provided on the base member and moves in the second axis direction;
- a third rotary bearing that is disposed around a third rod member fixed to the fifth linear bearing and is rotatable relative to the third rod member about a central axis of the third rod parallel to the third axis; and
- a sixth linear bearing that is connected to the third rotary bearing and is guided in the first axis direction by a sixth guide member fixed to the other edge of the table in the second axis direction.

4. The table apparatus according to claim 1, wherein
one of the at least two second drivers is connected to the one edge of the table in the second axis direction, and the other of the at least two second drivers is connected to the other edge of the table in the second axis direction.

5. The table apparatus according to claim 1, further comprising
a plane guide that is disposed between a lower surface of the table and a guide surface of the base member, and guides the table in a direction parallel to the predetermined plane in a state where the lower surface of the table faces the guide surface of the base member through a gap.

6. The table apparatus according to claim 5, wherein
the plane guide includes a slide member in a rod shape, and
the table apparatus further includes a guide bearing that is supported by the table and movably supports the slide member in a third axis direction parallel to the third axis.

7. The table apparatus according to claim 6, further comprising
a drive element that moves the plane guide in the third axis direction.

8. The table apparatus according to claim 1, further comprising
a preload device that applies force in advance to the table in a direction of rotation about the central axis of the table.

9. The table apparatus according to claim 8, wherein
the preload device includes: a preload actuator that is supported by the base member and generates power for moving the table in the second axis direction; and a preload movable member that is coupled to the table and moves along a preload drive axis parallel to the second axis by actuation of the preload actuator, and
the preload device is provided such that, in the first axis direction, a position of the central axis of the table differs from a position of the preload drive axis.

10. The table apparatus according to claim 9, wherein
the preload movable member includes: a seventh linear bearing that is guided by a seventh guide member provided on the base member and moves along the preload drive axis; a fourth rotary bearing that is disposed around a fourth rod member fixed to the seventh linear bearing and is rotatable relative to the fourth rod member about a central axis of the fourth rod parallel to the third axis; and an eighth linear bearing that is connected to the fourth rotary bearing and is guided in the first axis direction by an eighth guide member fixed to an edge of the table in the second axis direction.

11. The table apparatus according to claim 9, wherein
the preload device comprises at least two preload devices, and the at least two preload devices are provided such that, in the first axis direction, the position of the central axis of the table differs from a position of each preload drive axis, and
the at least two preload devices each apply different force to the table.

12. A positioning apparatus comprising the table apparatus according to claim 1, wherein
the positioning apparatus determines a position of a workpiece supported on the table of the table apparatus.

13. A flat panel display manufacturing apparatus comprising:
the table apparatus according to claim 1; and
a processing unit that processes a workpiece supported on the table.

14. A precision machine comprising:
the table apparatus according to claim 1; and
a processing unit that processes a workpiece supported on the table.

* * * * *